United States Patent
Bichotte et al.

(10) Patent No.: US 10,969,678 B2
(45) Date of Patent: Apr. 6, 2021

(54) SYSTEM AND METHOD FOR PRODUCING AN OPTICAL MASK FOR SURFACE TREATMENT, AND SURFACE TREATMENT PLANT AND METHOD

(71) Applicants: H.E.F., Andrezieux Boutheon (FR); UNIVERSITE JEAN MONNET SAINT ETIENNE, Saint Etienne (FR); CENTRE NATIONAL DE LA RECHERCHE SCIENTIFIQUE (CNRS), Paris (FR)

(72) Inventors: Maxime Bichotte, Haguenau (FR); Yves Jourlin, Saint Etienne (FR); Laurent Dubost, Chamboeuf (FR)

(73) Assignees: H.E.F., Andrezieux Boutheon (FR); Universite Jean Monnet Saint Etienne, Saint Etienne (FR); Centre National De La Recherche Scientifique (CNRS), Paris (FR)

( * ) Notice: Subject to any disclaimer, the term of this patent is extended or adjusted under 35 U.S.C. 154(b) by 317 days.

(21) Appl. No.: 16/311,287

(22) PCT Filed: Jun. 21, 2017

(86) PCT No.: PCT/FR2017/051648
§ 371 (c)(1),
(2) Date: Dec. 19, 2018

(87) PCT Pub. No.: WO2017/220929
PCT Pub. Date: Dec. 28, 2017

(65) Prior Publication Data
US 2019/0187554 A1 Jun. 20, 2019

(30) Foreign Application Priority Data
Jun. 21, 2016 (FR) ...................... 1655751

(51) Int. Cl.
*G03F 1/68* (2012.01)
(52) U.S. Cl.
CPC ...................... *G03F 1/68* (2013.01)
(58) Field of Classification Search
CPC ........................................ G03F 1/68
USPC ........................................... 430/5
See application file for complete search history.

(56) References Cited

FOREIGN PATENT DOCUMENTS

| | | |
|---|---|---|
| EP | 0759578 | 2/1997 |
| GB | 2253925 | 9/1992 |

OTHER PUBLICATIONS

International Search Report (English) and Written Opinion dated Aug. 17, 2017, from International Application No. PCT/FR2017/051648, 14 pages.
Varanasi, K. et al. "Spatial control in the heterogeneous nucleation of water", Applied Physics Letters, vol. 95, No. 9, Aug. 31, 2009, pp. 94101.
Alireza, B. et al. "Deep-UV microscope projection lithography", Optics Letters, Jun. 1, 2015, vol. 40, No. 11, pp. 2537-2540.
Pierre, C. et al. "Nanosphere Lithography: A Powerful Method for the Controlled Manufacturing of Nanomaterials", Journal of Nanomaterials, vol. 2013, 19 pages.
Haupt, M. et al. "Breath figures: Self-organizing masks for the fabrication of photonic crystals and dichroic filters", Journal of Applied Physics, vol. 96, No. 6, Sep. 15, 2004, pp. 3065-3069.
Bisetto, A. et al. "Dropwise condensation on superhydrophobic nanostructured surfaces: literature review and experimental analysis", Journal of Physics: Conference Series 501 (2014), 10 pages.
Wang, X. et al. "Femtosecond laser-induced mesoporous structures on silicon surface", Optics Communications 284 (2011) 317-321.
Ma, Y. et al. "Processing study of SU-8 pillar profiles with high aspect ratio by electron-beam lithography", Microelectronic Engineering 149 (2016) 141-144.
Mojarad, N. et al. "Interference lithography at EUV and soft X-ray wavelengths: Principles, methods, and applications", Microelectronic Engineering 143 (2015) 55-63.
Brueck, S.R.J. "Optical and Interferometric Lithography—Nanotechnology Enablers", Fellow, Proceedings of the IEEE, vol. 93, No. 10, Oct. 2005.
Al, B. et al. Plasmonic films based on colloidal lithography:, Advances in Colloid and Interface Science 206 (2014) 5-16.
Kosinova, A. et al. "Fabrication of hollow gold nanoparticles by dewetting, dealloying and coarsening", Acta Materialia 102 (2016) 108-115.
Vigneswaran, N. et al. "Recent Advances in Nano Patterning and Nano Imprint Lithography for Biological Applications", Procedia Engineering 97 (2014) 1387-1398.

*Primary Examiner* — Christopher G Young
(74) *Attorney, Agent, or Firm* — Meunier Carlin & Curfman LLC

(57) ABSTRACT

The invention relates to a system (2) for producing an optical mask (35) for surface treatment, in particular surface microtexturing, said system (2) comprising: a layer of material (20) which has an outer surface (21) that is exposed to the outside environment; and a generating and depositing device for generating and depositing droplets (30) on the outer surface (21) of the layer of material (20) in which a specific arrangement (31), forming the optical mask (35) on the outer surface (21) of the layer of material (20). The invention also relates to a treatment plant comprising a system (2) of said type. The invention further relates to a method for producing a mask as well as to a method for surface treatment.

17 Claims, 16 Drawing Sheets

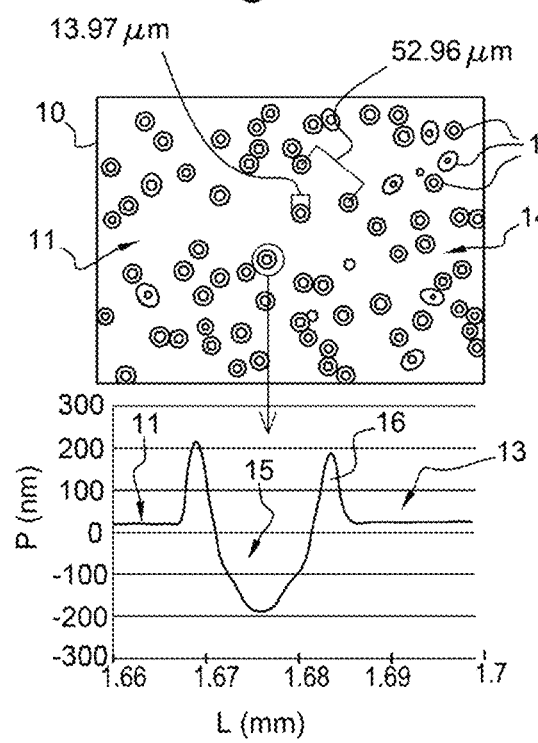
Fig. 14
Fig. 15
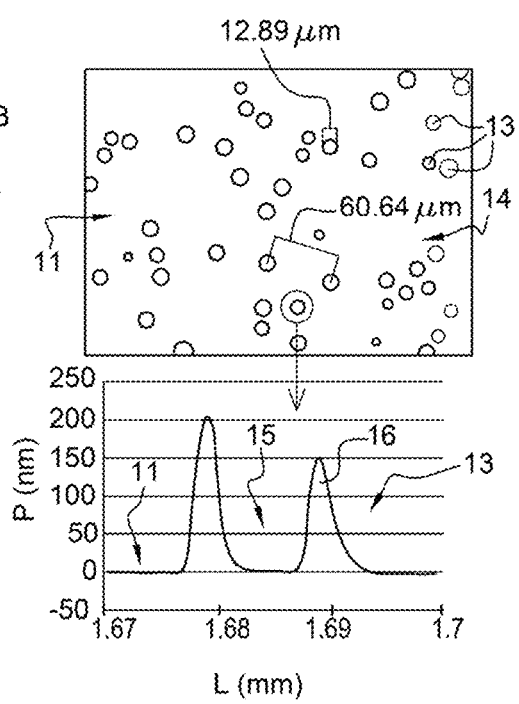
Fig. 16
Fig. 17
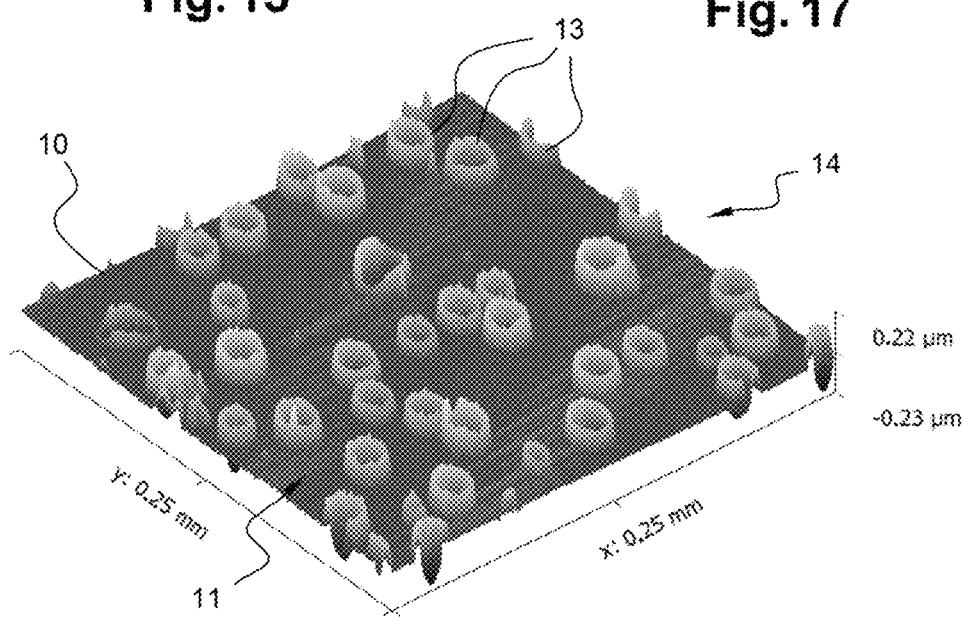
Fig. 18

SYSTEM AND METHOD FOR PRODUCING AN OPTICAL MASK FOR SURFACE TREATMENT, AND SURFACE TREATMENT PLANT AND METHOD

TECHNICAL FIELD

The present invention relates to a system and a method for producing an optical mask for surface treatment, in particular surface microtexturing. The invention also relates to a treatment plant and a surface treatment method.

BACKGROUND

Within the scope of the invention, the optical mask is constituted by droplets deposited on a surface exposed to the outside environment. According to a first embodiment, the droplets are used as a focusing optic, to concentrate a luminous flux on the surface. According to a second embodiment, the droplets are used as an occulting optic, to obstruct a luminous flux directed onto the surface.

The field of the invention is that of masking methods, as well as surface treatment methods, in particular surface texturing by photolithography and by laser etching.

Currently, various methods exist for texturing surfaces. These methods may be classified into two categories, namely direct methods on the one hand, and indirect methods involving the use of a mask, on the other hand. In this case, the structure obtained corresponds to the negative of the mask.

Direct texturing methods may implement a UV optical beam, an electron beam (e-beam), a laser beam, Fast Atom Bombardment (FAB) or Reactive Ion Beam Etching (RIBE). These methods enable complex and varied shapes to be obtained by direct ablation of a surface, but are not suitable for structuring large areas and non-planar substrates. Furthermore, these methods are generally expensive. Publications [1] and [2] below relate to such methods.

Indirect texturing methods may implement amplitude masks, phase masks, nanobeads, interferometric lithography, dewetting. However, these methods also have their own disadvantages.

Amplitude masks and phase masks have as a principle a contrast in lighting on the surface to obtain a periodic pattern (diffraction grating) in a photosensitive layer. They may be costly for small periods, of the micron or submicron order (electron beam manufacturing) and are not flexible in terms of dimensions and shapes of the structures obtained. The dimensions of the structures depend on the dimensions of the mask. The structures obtained are highly coherent, that is to say that they have a regular period for the wavelength considered. However, it is difficult to treat large surface areas. Publication [3] below relates to such methods.

Holography uses a laser beam separated into two arms then recombined at the surface of a sample coated in photosensitive resin. The interferogram (periodic intensity fringes) thus formed defines the diffraction grating obtained. Holography makes it possible to act on the period of the structure obtained, but requires the use of a laser and a complex optical assembly. It is possible to treat large surface areas, although this requires sizable equipment. Publication [4] below relates to such a method.

The use of nanobeads (colloidal lithography) focusing the light or used as a mask enables large surfaces to be textured with a periodic structure. The dimension of the beads is, however, fixed in advance. This method requires having a machine enabling Langmuir-Blodgett type films to be deposited. In this case, the pattern is imposed by the size of the beads. Publication [5] below relates to such a method.

Dewetting enables the formation of metallic nanoparticles by acting on the surface tension of a noble metal layer. The surface is covered with a nanometric layer of noble metal (gold, silver) by physical vapor deposition (PVD). At high temperature, the deposited layer forms nanoparticles of noble metals in order to minimize its surface energy. Consequently, dewetting is not suitable for texturing surfaces sensitive to high temperatures or vacuum. Furthermore, the particles formed only measure a few tens of nanometers. Publication [6] below relates to such a method.

Nanoimprint lithography (NIL) uses a template (or mold) to print a shape by pressing onto a layer of malleable resin. The printed shape is then stabilized by exposure under an ultraviolet lamp or by slow cooling of the resin layer. This step promotes curing of the resin by crosslinking the polymer chains. Nanoimprint lithography has the advantage of being low cost, however degradation of the template may be observed after a certain number of uses. The removal step is also sensitive and may lead to the appearance of defects in the structure. Publication [7] below relates to such a method.

The bibliographic references mentioned above are as follows:

[1] Femtosecond laser-induced mesoporous structures on silicon surface, Xianhua Wang, Feng Chen, Hewei Liu, Weiwei Liang, Qing Yang, Jinhai Si, Xun Hou, Optics Communications 284 (2011) 317-321

[2] Processing study of SU-8 pillar profiles with high aspect ratio by electron-beam lithography, Yaqi Ma, Yifan Xia, Jianpeng Liu, Sichao Zhang, Jinhai Shao, Bing-Rui Lu, Yifang Chen, Microelectronic Engineering 149 (2016) 141-144

[3] Interference lithography at EUV and soft X-ray wavelengths: Principles, methods, and applications, Nassir Mojarad, Jens Gobrecht, Yasin Ekinci, Microelectronic Engineering 143 (2015) 55-63

[4] Optical and Interferometric Lithography—Nanotechnology Enablers, S. R. J. BRUECK, FELLOW, PROCEEDINGS OF THE IEEE, VOL. 93, NO. 10, October 2005

[5] Plasmonic films based on colloidal lithography, Bin Ai, Ye Yu, Helmuth Möhwald, Gang Zhang, Bai Yang, Advances in Colloid and Interface Science 206 (2014) 5-16

[6] Fabrication of hollow gold nanoparticles by dewetting, dealloying and coarsening, Anna Kosinova, Dong Wang, Peter Schaaf, Oleg Kovalenko, Leonid Klinger, Eugen Rabkin, Acta Materialia 102 (2016) 108-115

[7] Recent Advances in Nano Patterning and Nano Imprint Lithography for Biological Applications, N. Vigneswaran, Fahmi Samsuri, Balu Ranganathan, Padmapriya, Procedia Engineering 97 (2014) 1387-1398

The texturing methods described above have various disadvantages. These methods are relatively costly and/or poorly suited to three-dimensional substrates and/or complex to implement. Furthermore, these methods are generally intended for applications requiring regular microtexturing profiles, which have very precise periodicities and alignments. However, this regularity is not essential for all applications. Thus, the over-quality and therefore the over-cost induced by these methods may hinder their use in new applications. Further, certain applications, on the contrary, require a very large spatial distribution (in size and periodicity).

SUMMARY

The aim of the present invention is to propose improved systems and methods for producing a mask, as well as surface treatment.

As such, the invention relates to a system for producing an optical mask for surface treatment, in particular for surface microtexturing, said system comprising: a layer of material which has an outer surface that is exposed to the outside environment; and a generating and depositing device for generating and depositing droplets on the outer surface of the layer of material, in a specific arrangement, forming the optical mask on the outer surface of the layer of material.

Thus, by using droplets as focusing or occulting optics, the invention enables a mask to be made for a very low cost in comparison to the majority of existing methods. The droplets are easy to form, then to clean. The invention does not require the implementation of optical system positioning devices with submicron precision, nor the implementation of a Langmuir-Blodgett machine. The invention also enables problems of mold degradation specific to nanoimprint technologies to be avoided. In contrast to dewetting, the invention does not necessitate annealing, problematic for materials sensitive to high temperatures.

Further, the invention enables large surface areas to be treated, as well as different substrate shapes: curved, spherical, parabolic, cylindrical-circular or any other complex geometry.

The present invention may find applications in numerous technical fields: photolithography, optics, mechanics, electromagnetism, tribology, chemistry, biology, etc. In optics, these applications in particular relate to optical trapping, light scattering, blackbody manufacturing, anti-reflective. In fluid mechanics, these applications in particular relate to hydrodynamics, the shark skin effect, golf ball effect, turbulent boundary layer. In tribology, an application relates to the lubrication of contact interfaces. In chemistry, an application relates to the increase in the specific surface area within the scope of catalysis, or making surface enhanced Raman scattering (SERS) sensors. Other applications relate to the wettability of surfaces, hydrophobicity, etc.

Furthermore, the invention may be implemented within the scope of surface treatments other than microtexturing, where the droplets may be advantageously used as focusing or occulting optics. Such treatments consist of modifying the properties of a surface for the functionalization thereof, without necessarily modifying the relief thereof. For example, these treatments may modify the optical properties (refractive index), mechanical properties (hardness, abrasion-resistance), chemical properties (wettability, preferential molecule binding sites) or electrical properties (resistivity) of the surface.

According to other advantageous characteristics of the system for producing an optical mask according to the invention, taken in isolation or in combination:

The generating and depositing device comprises a sealed enclosure, having a gaseous atmosphere with controlled temperature and humidity levels, such that the droplets condense in a controlled manner on the outer surface of the layer of material.

The generating and depositing device comprises a unit for cooling a lower surface of the layer of material.

The generating and depositing device comprises a control unit by imaging the arrangement of droplets on the outer surface of the layer of material.

The system comprises a pretreating device for pretreating the layer of material, designed to define the preferential fixing sites of the droplets to the outer surface of the layer of material, thus enabling the arrangement of droplets forming the optical mask on the outer surface to be controlled. In other words, the outer surface of the layer of material is initially treated (that is to say before the layer of material is introduced into the droplets generating and depositing device) to define the preferential fixing sites.

The preferential fixing sites are distributed over the outer surface such that the arrangement of droplets is regular.

The system comprises a substrate having a surface covered by the layer of material.

The layer of material is permeable to the luminous flux, and the system comprises a substrate having a surface arranged opposite the layer of material. In this case, the layer of material may be positioned on the substrate, or even separated relative to the substrate.

The droplets are constituted of water, an aqueous solution, oil, liquid polymer (for example silicone) or metal.

Another aim of the invention is a surface treatment plant, in particular for surface microtexturing.

According to a particular embodiment, the treatment plant comprises: a system for producing an optical mask as mentioned above; and a localized treatment device for the localized treatment of the layer of material, depending on the arrangement of the droplets forming the optical mask on the outer surface, through the optical mask formed by these droplets on the layer of material. The location of the treatment depends on the arrangement of the droplets forming the optical mask. The treatment is carried out through this optical mask.

In the case of a surface microtexturing plant, the localized treatment device for the localized treatment of the layer of material is a localized removal device for localized removal depending on the arrangement of the droplets on the outer surface, through the optical mask formed by these droplets on the layer of material.

According to another particular embodiment, the treatment plant comprises: a system for producing an optical mask such as mentioned above, comprising a substrate having a surface covered by the layer of material; a localized removal device for localized removal of the layer of material, depending on the arrangement of droplets on the outer surface, through the optical mask formed by these droplets on the layer of material, which thus has removal areas and material areas forming a second mask on the substrate; and a localized treatment device for the localized treatment of the surface of the substrate through the second mask formed by the layer of material on the substrate.

According to another particular embodiment, the treatment plant comprises: a system for producing an optical mask as mentioned above, comprising a layer of material permeable to the luminous flux, and a substrate having a surface arranged opposite the layer of material; and a localized treatment device for localized treatment of the substrate, depending on the arrangement of droplets forming the optical mask on the outer surface of the layer of material, through the optical mask formed on the layer of material permeable to the luminous flux.

In the case of a surface microtexturing plant, the localized treatment device for localized treatment of the surface of the substrate is a localized removal device for localized removal depending on the arrangement of the droplets on the outer surface, through the optical mask formed by these droplets on the layer of material.

In the case where the substrate is made from a photosensitive material, the localized treatment device of the substrate comprises, firstly, an exposure unit emitting a luminous flux which passes through the droplets and reaches the surface of the substrate and, secondly, a unit for developing the substrate after exposure to the luminous flux.

According to other advantageous characteristics of the treatment plant according to the invention, taken in isolation or in combination:

The layer of material is made from a photosensitive material and the device for the localized treatment of the layer of material comprises, firstly, an exposure unit emitting a luminous flux which passes through the droplets and reaches the outer surface of the material and, secondly, a unit for developing the layer of material after exposure to the luminous flux.

The layer of material is made from a positive photosensitive material, such that the areas of treatment of the layer of material are situated directly under the droplets.

The layer of material is made from a negative photosensitive material, such that the areas of treatment of the layer of material are situated around and between the droplets.

The localized treatment device is a microtexturing device, comprising for example a reactive ion etching unit, a chemical etching unit or an optical etching unit.

The present invention also relates to a method for producing an optical mask for surface treatment, in particular surface microtexturing. This method comprises the following steps: a step of providing a layer of material having an outer surface that is exposed to the outside environment; and a step for generating and depositing droplets on the outer surface of the layer of material, in a specific arrangement, thus forming the optical mask on the outer surface of the layer of material.

The invention also relates to a surface treatment method.

According to a particular embodiment, the surface treatment method comprises the following successive steps:
  a) a step of providing a layer of material having an outer surface that is exposed to the outside environment;
  b) a step of generating and depositing droplets on the outer surface of the layer of material, in a specific arrangement, thus forming the optical mask on the outer surface of the layer of material; and
  c) a step of localized treatment of the layer of material depending on the arrangement of the droplets on the outer surface, through the optical mask formed on the layer of material.

In this embodiment, the step of localized treatment of the layer of material may be a step of localized removal of the layer of material. Thus, the surface treatment method constitutes a method of microtexturing the outer surface of the layer of material.

According to another particular embodiment, the surface treatment method comprises the following successive steps:
  a) a step of providing a substrate having a surface covered by a layer of material having an outer surface that is exposed to the outside environment;
  b) a step of generating and depositing droplets on the outer surface of the layer of material, in a specific arrangement, thus forming an optical mask on the outer surface of the layer of material;
  c) a step of localized removal of the layer of material depending on the arrangement of the droplets on the outer surface, through the optical mask formed on the layer of material, which thus has removal areas and material areas forming a second mask on the substrate; and
  d) a step of localized treatment of the surface of the substrate through the second mask formed by the layer of material on the substrate.

In this embodiment, the step of localized treatment of the surface of the substrate may be a step of localized removal of the surface of the substrate. Thus, the surface treatment method constitutes a method of microtexturing the surface of the substrate.

According to another particular embodiment, the surface treatment method comprises the following successive steps:
  a) a step of providing a layer of material permeable to luminous radiation and having an outer surface that is exposed to the outside environment;
  b) a step of providing a substrate having a surface arranged opposite to the layer of material;
  c) a step of generating and depositing droplets on the outer surface of the layer of material, in a specific arrangement, thus forming an optical mask on the outer surface of the layer of material;
  d) a step of localized treatment of the surface of the substrate through the optical mask formed by the droplets on the layer of material.

During the treatment step d), a relative displacement may be carried out between the surface of the substrate and the layer of material supporting the droplets forming the optical mask, so as to regularly reproduce on the surface of the substrate a pattern defined by the optical mask.

If needed, the step of generating and depositing droplets is repeated several times to modify the arrangement of the droplets forming the optical mask, before carrying out the next localized treatment step (removal or other) of the layer of material or of the substrate.

According to other advantageous characteristics of the methods according to the invention, taken in isolation or in combination:

In the step of providing, the layer of material is positioned in a sealed enclosure, having a gaseous atmosphere having controlled temperature and humidity, and in the generating and depositing step, the droplets condense on the outer surface of the layer of material.

In the step of generating and depositing, the droplets are sprayed onto the outer surface of the layer of material.

In the step of generating and depositing, the droplets are deposited by gravity onto the outer surface of the layer of material.

The layer of material is made from photosensitive material, and the step of localized treatment of the layer of material implements, initially, a sub-step of exposure of the layer of material through the droplets, and secondly, a sub-step of development of the layer of material after exposure.

The layer of material is made from a positive photosensitive material, such that the areas of localized treatment of the layer of material are situated directly under the droplets.

The layer of material is made from a negative photosensitive material, such that the areas of localized treatment of the layer of material are situated around and between the droplets.

Before the step of generating and depositing droplets, the method comprises a step of pretreating the layer of material, the pretreatment defining preferential fixing sites of the droplets to the outer surface of the layer of material, thus enabling the arrangement of droplets forming the optical mask on the outer surface to be controlled.

BRIEF DESCRIPTION OF THE DRAWINGS

The invention will be better understood upon reading the following description, given solely as a non-limiting example, and made with reference to the accompanying figures wherein:

FIG. 14 is a view from above of another substrate example having a textured surface according to the invention;

FIG. 15 is a transverse cross-section view of a cavity formed on the textured surface of FIG. 14;

FIGS. 16 and 17 are analogous to FIGS. 14 and 15 respectively, for another substrate example having a textured surface according to the invention;

FIG. 18 is a perspective view, obtained using a tactile profilometer, of another substrate example having a textured surface according to the invention;

DETAILED DESCRIPTION

Figure 1:
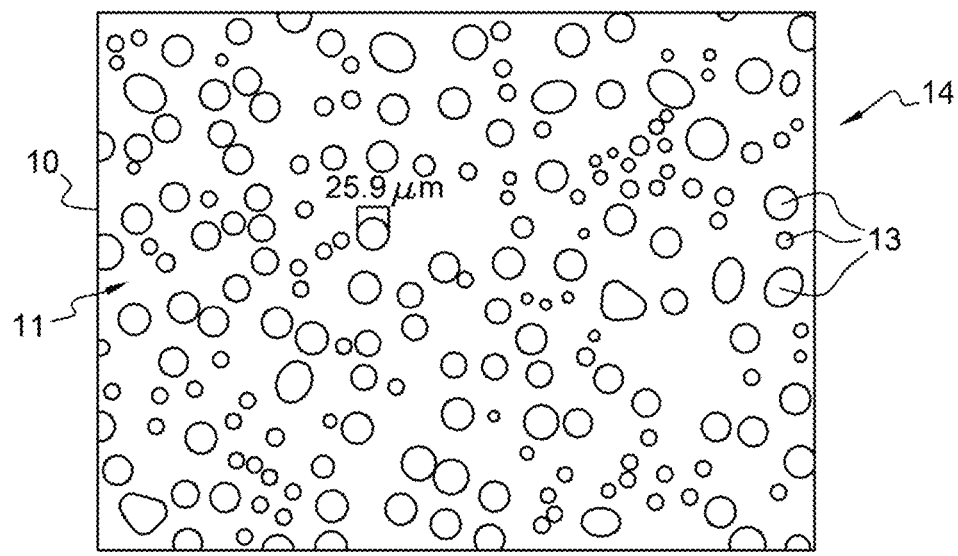
FIG. 1 is a view from above of a substrate having a textured surface according to the invention.

FIG. 1 shows a substrate 10 having a microtextured surface 11 by implementing the invention.

The substrate 10 has cavities 13 of variable shapes and dimensions, open at the level of the surface 11. The cavities 13 have widths, defined parallel to the surface 11, in the order of a few tens of micrometers, for example 25.9 µm for one of the cavities 13 shown in FIG. 1.

The cavities 13 together form an irregular microtexturing profile 14 at the surface 11 of the substrate 10. The method of microtexturing the surface 11, consisting of providing the cavities 13 in the substrate 10, and thus forming the microtexturing profile 14 at the surface 11, is detailed below.

Figure 2:
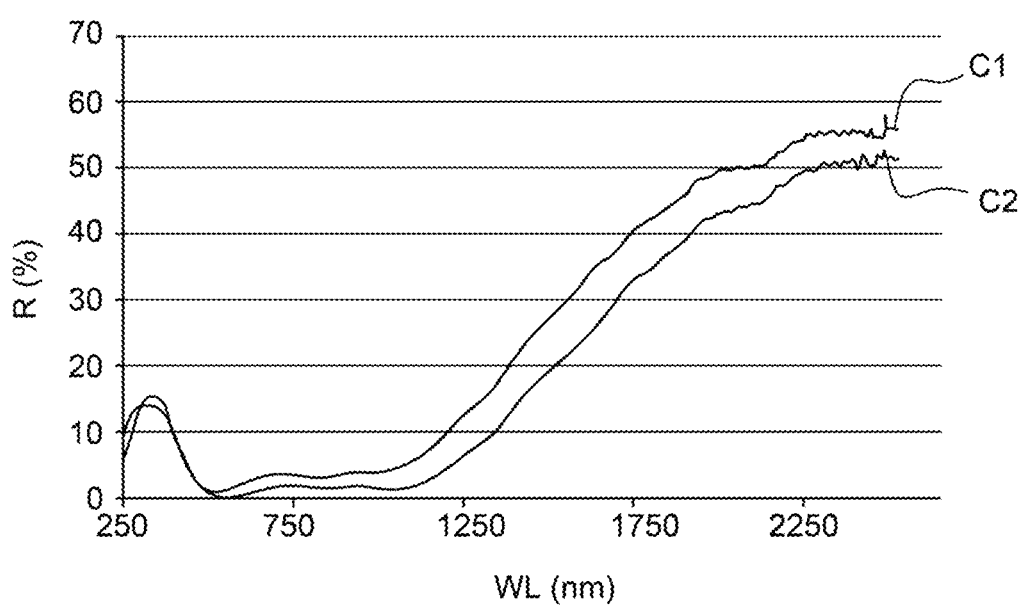
FIG. 2 is a graph showing the advantages of the invention within the scope of a thermal solar application.

FIG. 2 shows an example of use of the substrate 10 having an irregular microtexturing profile 14, namely the manufacture of a spectrally selective absorber for a solar thermal application.

On the graph in FIG. 2, the x-axis represents a wavelength WL in nanometers, while the y-axis represents reflectance R in percentage. Curve C1 corresponds to a solar absorber deposited on a flat surface, while curve C2 corresponds to an identical solar absorber deposited on surface 11 having the irregular microtexturing profile 14 shown in FIG. 1. In this example, the absorber is made from TiAlN (titanium-aluminum nitride).

In comparison with the flat absorber, we see that the textured absorber has a better absorption of the solar spectrum in the visible wavelengths (380-700 nm) and near infrared (700-2500 nm). The absorption is defined as the total of the absorbance over the range of wavelengths considered above (380-2500 nm).

FIGS. 3 to 9 show different constituent elements of a microtexturing plant 1 in accordance with the invention, implemented to texture the surface 11 of the substrate 10. The plant 1 comprises various devices 40, 50 and 60.

Within the plant 1, the invention relates in particular to a system 2 of producing an optical mask 35 constituted by an arrangement 31 of droplets 30, as detailed below. The system 2 comprises the device 40.

In the example from FIGS. 3 to 8, the substrate 10 has a parallelepipedal shape. The substrate 10 has an upper surface 11 and a lower surface 12, flat and parallel to each other.

Alternatively, the substrate 10 can have any shape suitable for the intended application, for example a tubular shape.

By way of examples, the substrate 10 may be made from silicon, glass, polymer, metal, etc.

The substrate 10 also has a layer of material 20 covering the surface 11 to be textured. This covering of the surface 11 by the layer 20 may be full or partial. The layer 20 may be deposited on the surface 11 of the substrate 10 by any suitable means, for example spin coating. The layer 20 is preferably made from photosensitive material, for example, a polymeric material such as the resin S1805, which is relatively hydrophobic. The hydrophobic nature of the material of the layer 20 influences the formation of the droplets 30.

By way of example, the substrate 10 has a thickness in the order of 1 to 2 mm, while the layer 20 has a thickness in the order of 100 nm to 500 nm. In the figures, these thicknesses are shown with a same order of magnitude for the purposes of simplicity.

The layer 20 has an upper surface 21 and a lower surface 22. The surface 21 may be qualified as an outer surface, in so far as it is exposed to the outside environment, whereas the surface 22 may be qualified as an inner surface, in so far as it is positioned against the surface 11, and therefore arranged between the layer 20 and the substrate 10.

The surface 21 may receive a chemical pretreatment to modify its wettability, in full or in part, for example by using a plasma process or by wet processing.

The surface 21 may receive a functionalization pretreatment enabling the preferential fixing sites of the droplets 30 to be defined. The functionalization pretreatment may be carried out by laser, plasma, exposure or any other suitable means. For example, a chemical pretreatment is carried out locally modifying the wettability of the surface 21, or scanning of the surface 21 is carried out by generating laser pulses, according to a regular or irregular pattern.

Figure 3:
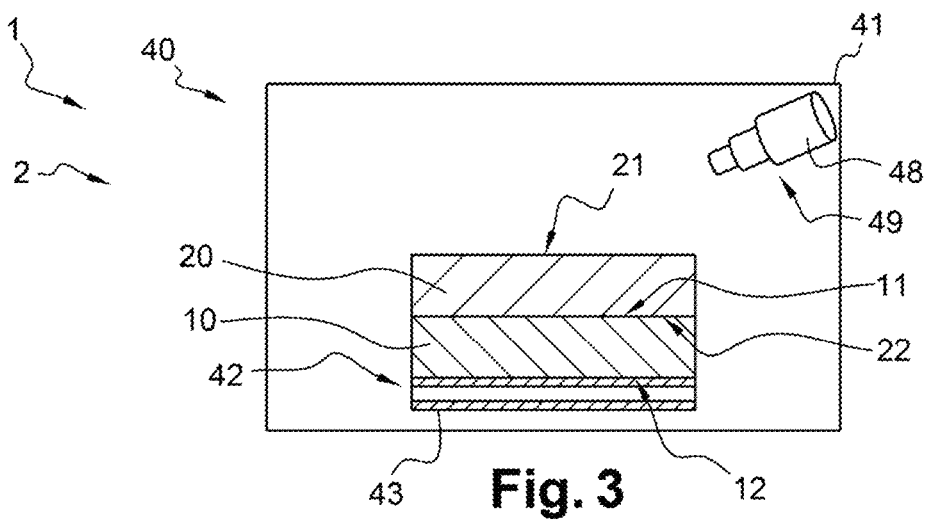
FIGS. 3 to 9 are cross-section views showing various constituent elements of a surface microtexturing plant in accordance with the invention, implementing a positive photosensitive resin, and focusing droplets having variable shapes and dimensions as well an irregular spatial distribution.
Figure 4:
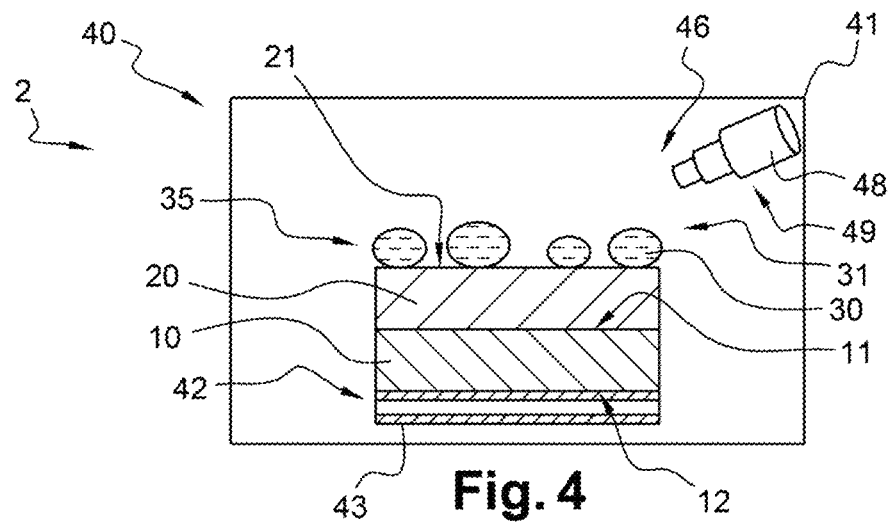
Figure 5:
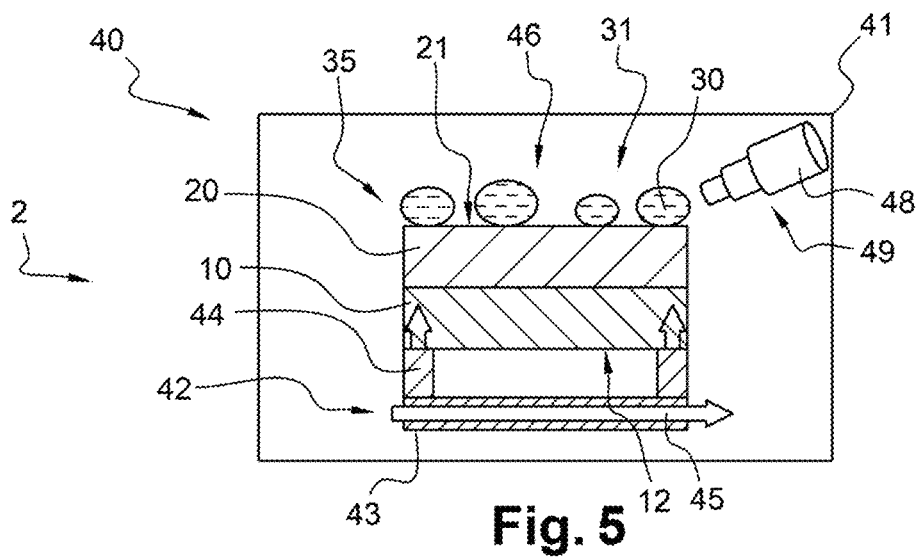

FIGS. 3 to 5 show the substrate 10 positioned in a generating and depositing device 40, intended to create droplets 30 then to deposit said droplets on the surface 21 of the layer 20.

The device 40 comprises a sealed enclosure 41 and a cooling unit 42 arranged within the enclosure 41. The substrate 10 coated with the layer 20 is initially placed on the unit 42, such that the surfaces 11 and 21 are directed upwards. The enclosure 41 has a gaseous atmosphere 46 with controlled temperature and humidity.

The unit 42 cools the lower surface 12 of the substrate 10, then the surface 21, by thermal conduction. By altering the temperature difference between the surface 21 and the atmosphere 46 of the enclosure 41, it is possible to produce condensation from the gas present in the atmosphere 46, if the partial pressure of this gas within the enclosure 41 is sufficient. Generally, the gas present in the atmosphere 46 is water vapor, but other gases may be used, such as for example oil or silicone vapors.

The unit 42 comprises a support 43 and retractable feet 44. The support 43 is a metal plate, crossed by a flow of cold water 45 having a controlled temperature. For example, the flow 45 has a temperature in the order of 5° C. Alternatively, the flow 45 may be constituted by another fluid suitable for the intended application, such as glycol-water or liquid nitrogen. Thermal exchanges may be improved by polishing the support 43 and/or by depositing a film of water between the surface 12 and the support 43. The feet 44 may be activated to bring the surface 12 of the substrate 10 in contact with the support 43, as in FIG. 4, or to separate this surface 12 from the support 43, as in FIG. 5.

When the surface 12 is positioned against the support 43, the temperature of the substrate 10 then the layer 20 decreases. The cooling of the surface 21 increases the condensation of the droplets 30. When the arrangement 31 of the droplets 30 is satisfactory, the feet 44 are activated to separate the substrate 10 from the support 43 and stop condensation. Thus, the unit 42 enables the condensation of droplets 30 on the surface 21 to be controlled. The arrangement 31 is considered to be satisfactory when the shapes, dimensions and distribution of the droplets 30 are compliant with the predefined criteria depending on the intended application. For example, in the case of a solar thermal application illustrated in FIGS. 1 and 2, obtaining droplets 30 having a size in the order of a few tens of micrometers and a distribution in the order of 50 to 150 droplets per mm$^2$ constitutes two criteria to be met. The criteria are defined on a case by case basis for each application.

The device 40 also comprises a unit 48 for controlling the arrangement 31 of the droplets 30 on the surface 21. The unit 48 comprises for example a laser camera 49, a microscope, a binocular magnifier or any other imaging system. The unit 48 makes it possible to control the condensation of the droplets 30, in situ, directly in the enclosure 41. Thus, stopping the condensation of the droplets 30 is extremely easy, when the arrangement 31 is compliant with the desired result regarding shapes, dimensions and distribution of the droplets 30.

The droplets 30 condense on the surface 21 according to an irregular and random spatial arrangement 31. More precisely, the droplets 30 have variable shapes and dimensions, as well as an irregular spatial distribution.

The arrangement 31 of the droplets 30 may be modified by adjusting various factors, such as the amplitude of the temperature difference between the surface 21 and the atmosphere 46, the partial pressure of the water vapor and therefore the relative humidity within the enclosure 41, the condensation duration, the pretreatments applied to the surface 21 before depositing the droplets 30, etc.

After depositing and condensation, the droplets 30 distributed according to the arrangement 31 form the optical mask 35 on the surface 21 of the layer 20. The substrate 10 having the layer 20 and the droplets 30 may then be removed from the enclosure 41.

Figure 6:
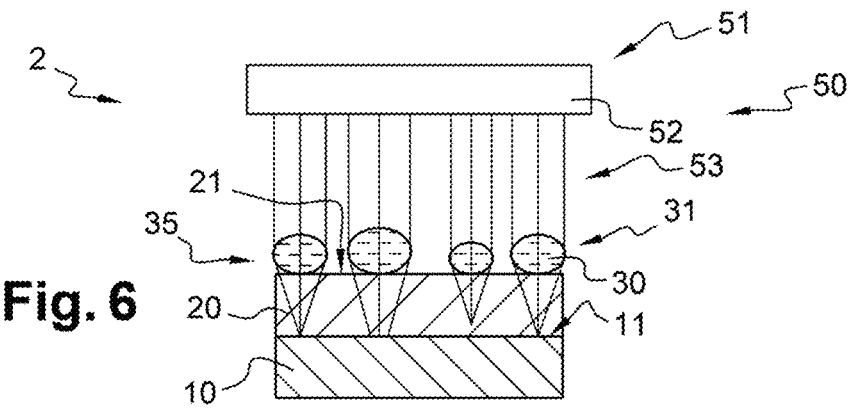
Figure 7:
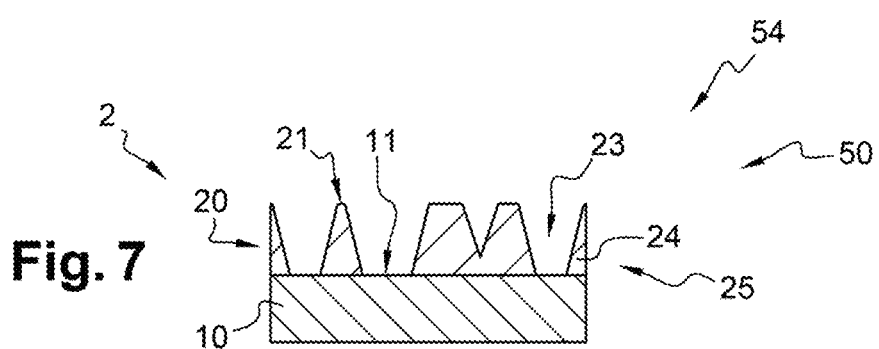

FIGS. 6 and 7 show a device 50 for localized removal of the layer of material 20, depending on the arrangement 31 of the droplets 30 on the surface 21, to form a mask 25 on the substrate 10. More precisely, the step of localized removal of the layer 20 comprises an exposure sub-step shown in FIG. 6, and a developing sub-step shown in FIG. 7. The device 50 comprises an exposure unit 51 and a developing unit 54.

FIG. 6 show an exposure unit 51 comprising a light source 52, for example an ultraviolet lamp. The source 52 emits a luminous flux 53 which passes through the droplets 30 to reach the surface 21. At this stage, each of the droplets 30 constitutes a convex aspherical lens locally focusing the luminous flux 53. The focal length of each lens depends on the shape of the droplet 30. The layer of material 20 made from photosensitive resin is affected by the light beam 53 focused by the droplets 30, which locally increase the dose of exposure received.

On the example in FIGS. 6 to 9, the layer 20 is made from positive photosensitive resin, and the droplets 30 fulfill an optical function of concentrating the luminous flux 53. The areas of the layer 20 exposed to the beam 53 become soluble to development, while the areas of the layer 20 which are not exposed or weakly exposed remain insoluble.

After exposure, the substrate 10 and the layer 20 are dried with nitrogen, then transferred to the developing unit 54. The developing technique depends on the material of the layer 20. For example, in the case where the layer 20 is resin S1805, the development consists of soaking the layer in an MF319 solution comprising around 97 to 98% water and 2.45% tetramethylammonium hydroxide.

In order to obtain a profile 14 having a greater pattern density at the surface 11, it is possible to carry out several condensation, exposure and drying cycles before developing.

FIG. 7 shows the layer of material 20 after development by the unit 54. The layer 20 thus has areas 2l of removed material and areas 24 of remaining material. The layer 20 thus forms the mask 25, which is arranged on the substrate 10. The areas 23 and 24 have variable dimensions, resulting from the irregular arrangement 31 of the droplets 30 in FIG. 6.

On the example of FIG. 7, the layer 20 is made from positive photosensitive resin. The areas 23 are situated directly under the droplets 30 of FIG. 6 in the form of holes, while the areas 24 are situated around and between the droplets 30 of FIG. 6.

Figure 8:
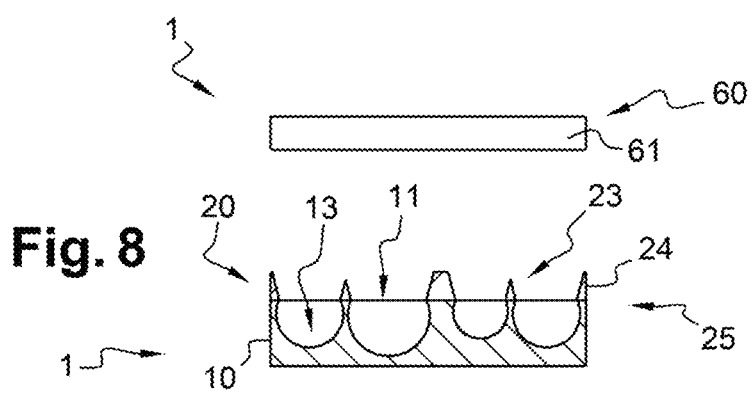

FIG. 8 shows a device 60 for microtexturing the surface 11 through the mask 25. The arrangement of the cavities 13, and therefore the microtexturing profile 14 formed at the surface 11, depends on the arrangement of the areas 23 and 24 of the layer 20 forming the mask 25. The microtexturing may be carried out by wet processing, dry processing or laser ablation, notably depending on the substrate material 10 and the intended application.

In the example of FIG. 8, the device 60 comprises a reactive ion etching unit 61. Alternatively, the device may comprise a chemical etching unit, ablation unit or any other etching unit suitable for the intended application. For example, when the substrate 10 is made from aluminum, the surface 11 may be etched by immersion in a mixture of phosphoric acid and nitric acid (Transene Aluminum Etchant Type A ©).

After etching, the resin residues of the layer 20 may be removed according to various methods, for example immersion in acetone, or by ultrasonic agitation. The method selected notably depends on the materials of the substrate 10 and of the layer 20.

Figure 9:
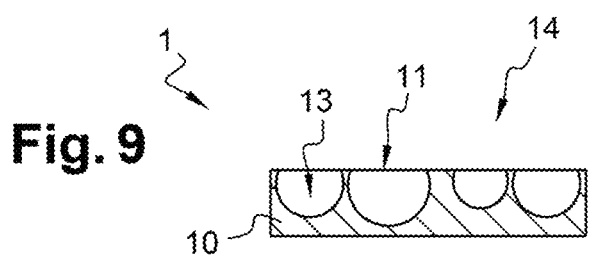

FIG. 9 shows the final substrate 10, having cavities 13 distributed according to the microtexturing profile 14. As the arrangement 31 of droplets 30 was irregular, the cavities 13 have irregular shapes, dimensions and distribution.

A practical example of implementing the invention is defined below. This example relates to the manufacture of a spectrally-selective absorber for a solar thermal application.

The results of FIGS. 1 and 2 are obtained by implementing the plant 1 from FIGS. 3 to 9 with the following parameters:

The substrate 10 is made from stainless steel 304L and has a parallelepiped shape, with a thickness of 1 mm, a length of 50 mm and a width of 50 mm.

The layer 20 is made from photosensitive resin S1805 and has a thickness of 300 nm.

The layer 20 is deposited on the surface 11 of the substrate 10 by spin coating.

The surface 21 of the layer 20 does not receive any pretreatment.

The enclosure 41 has a height of 300 mm, a length of 200 mm and a width of 200 mm.

The support 43 is made from steel. Its upper surface is not polished and does not receive a water film before receiving the substrate 10.

The flow 45 of cold water circulates in the support at a temperature of 5° C.

The atmosphere 46 in the enclosure 41 initially has a temperature of 25° C. and a humidity of 50%.

The droplets 30 formed on the surface 21 of the layer 20 by condensation in the enclosure 41 are constituted of water, having a refractive index in the order of 1.33. These droplets 30 have a semi-elliptical shape, a size of between 10 μm and 50 μm, and a distribution in the order of 160 to 400 droplets 30 per 1 mm$^2$.

The light source 52 is an ultraviolet lamp, emitting over a wavelength between 365 and 435 nm. The power of the lamp is 100 W. The exposure duration of the layer 20 is 10 seconds.

The developing unit 54 implements an MF319 solution comprising around 97 to 98% water and 2.45% tetramethylammonium hydroxide, in which the layer 20 is soaked after exposure by the luminous flux 53. The developing lasts for a few seconds.

The microtexturing device 60 comprises a reactive ion etching unit 61.

After etching, the resin residues of the layer 20 are removed from the substrate 10 by immersion in acetone.

The cavities 13 formed at the surface 11 of the substrate 10 have widths and depths in the order of a few tens of micrometers.

The microtexturing plant 1 of surface 11 and the system 2 for producing the optical mask 35 may be arranged differently from FIGS. 3 to 9 without departing from the scope of the invention.

For example, in place of condensation, the device 40 for generating and depositing droplets 30 may operate by spraying, by gravity or by any other suitable method.

According to another example, the substrate 10 and the layer 20 may be positioned in the opposite direction, such that the substrate 10 is above and the layer 20 is below. The substrate 10 coated with the layer 20 is initially placed in the device 40, such that the surfaces 11 and 21 are directed downwards. The droplets 30 form the optical mask 35 on the outer surface 21 of the layer 20.

Depending on the liquid constituting the droplets 30, obtained by condensation of a gas within the enclosure 41, the droplets 30 are likely to fulfill an optical function of focusing or occulting the luminous flux 53 in the device 50.

The droplets 30 may be constituted of water, an aqueous solution, oil, liquid polymer (such as silicone), metal, etc.

The composition of the droplets 30 modifies their refractive index enabling the focusing to be changed in the case of a focusing optic. Also, the composition of the droplets 30 modifies the surface tension thereof on the layer 20, enabling the shapes, dimensions and dimensional distribution of the droplets 30 to be changed.

The table below indicates various compositions of the droplets 30 and the corresponding refractive indices:

| LIQUID | REFRACTIVE INDEX |
| --- | --- |
| Water | 1.33 |
| Acetone | 1.36 |
| Glycerine | 1.47 |
| Benzene | 1.5 |
| Silicone oil | 1.33-1.58 |
| Sodium chloride | 1.54 |
| Ethanol | 1.36 |
| 10% glucose in water | 1.348 |
| 20% glucose in water | 1.363 |
| 30% glucose in water | 1.439 |

FIGS. 10 to 13 illustrate in more detail the exposure sub-step shown in FIG. 6, and the development sub-step shown in FIG. 7, by considering a single droplet 30.

Figure 10:
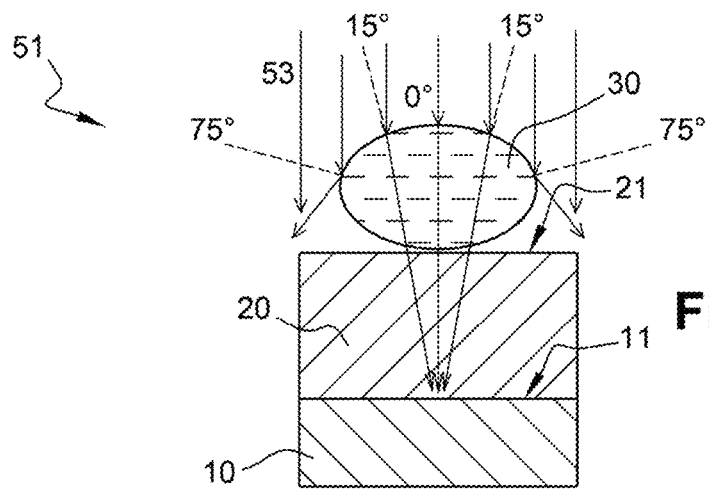
FIG. 10 is a cross-section view analogous to FIG. 6, on a larger scale, considering a single droplet.

FIG. 10 shows the luminous flux 53 reaching the surface of the droplet 30 in the form of a collimated beam. The rays form different angles of incidence at the air/drop interface, depending upon the meeting point of the incident ray with the curved surface of the drop. Thus, the nearer to the end of the drop the light ray hits, the greater than angle of incidence. The reflectance at the air/drop interface depends on the angle of incidence.

Figure 11:
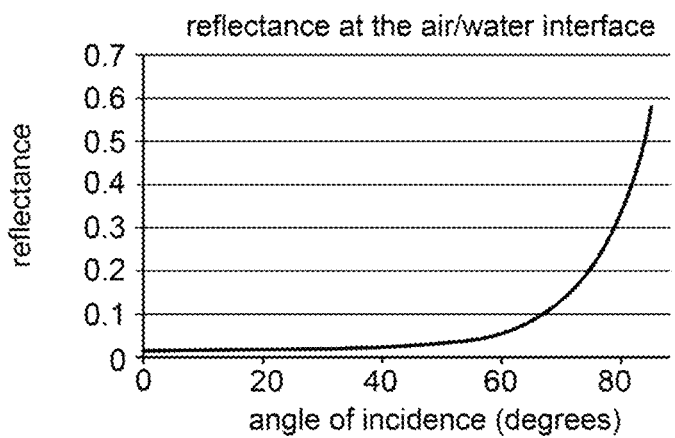
FIG. 11 is a graph illustrating the evolution of the reflectance as a function of the angle of incidence at the air/water interface.

The graph in FIG. 11 illustrates the evolution of the reflectance (y-axis) as a function of the angle of incidence (x-axis) at the air/water interface. It is noted that the reflectance greatly increases when the angle of incidence exceeds 60°. The quantity of light received by the layer 20 on the edges of the droplet 30 is therefore low due to high reflectivity, linked to a grazing incidence. The droplet 30 focuses the light at the center thereof, but protects and masks the layer 20 at the edges of said droplet.

Figure 12:
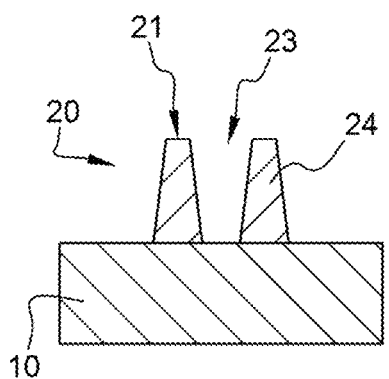
FIG. 12 is a cross-section view analogous to FIG. 7, on a larger scale, showing the resin of FIG. 10 after development.
Figure 13:
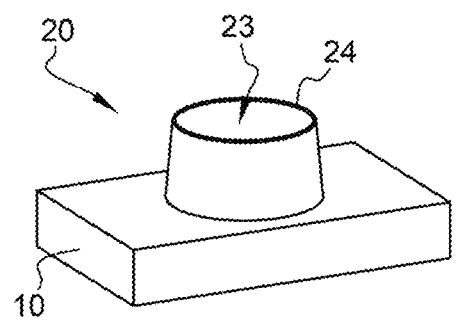
FIG. 13 is a perspective view of the resin of FIG. 12.

FIGS. 12 and 13 show the photosensitive layer 20 after developing, under the droplet 30. The result is a structure with a tubular geometry.

FIGS. 14 to 18 show other examples of surfaces 11 obtained by implementing the invention.

In FIGS. 14 and 15, the cavities 13 have a crater shape, with a hollow 15 deeper than the surface 11 and rims 16 that are higher than the surface 11. As explained above with reference to FIGS. 10 to 13, each of the droplets 30 focuses the beam 53 at the center of said droplet, and masks the light at the periphery of said droplet due to a high angle of incidence. The photosensitive resin S1805 used for the layer 20 is called positive. The removal of the areas of the layer 20 most exposed to the UV light is therefore more significant during developing (with a basic developer MF319), which explains the structure obtained for the surface 11.

In FIGS. 16 and 17, the cavities 13 have another crater shape, with a hollow 15 the bottom of which is situated at the level of the surface 11, while the rims 16 are higher than the surface 11. The shape of the droplets 30 is different from that implemented in the example of FIGS. 14 and 15 due to a different cooling time. This different drop shape enables the focusing of the beam 53 on the layer 20 to be modified. Thus, variable droplet shapes 30 cause a variable exposure of the resin.

In FIG. 18 a substrate 10 is shown in perspective, which enables the shape of the craters to be better visualized. This FIG. 18 was obtained by scanning the surface 11 shown in FIG. 14 using a tactile profilometer.

FIGS. 19 to 53 show different embodiments of the invention. With a view to simplification, elements similar to the first embodiment described above have the same numerical references.

In the embodiment of FIGS. 19 to 22, the layer 20 is made from positive photosensitive resin, and the droplets 30 fulfill an optical function of concentrating the luminous flux 53.

Figure 19:
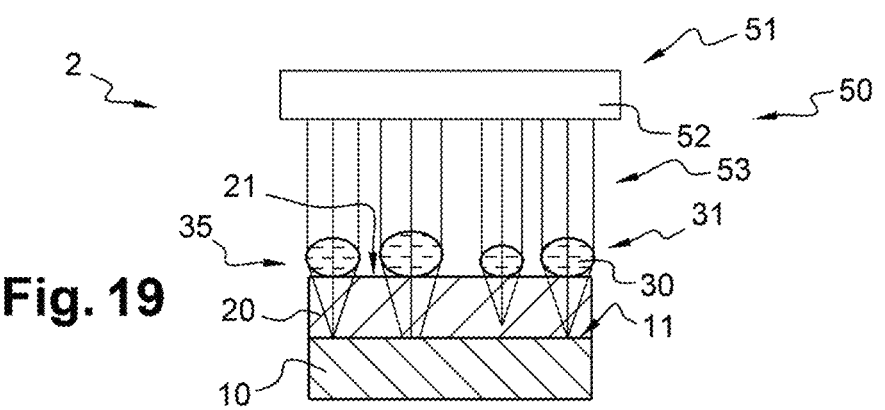
FIGS. 19 to 22 are cross-section views analogous to FIGS. 6 to 9 respectively, for a variant of the invention implementing a negative photosensitive resin.

On FIG. 19, during exposure by the unit 51, the areas of the layer 20 exposed to the beam 53 become insoluble to development, while the areas of the layer 20 which are not exposed or weakly exposed remain soluble.

Figure 20:
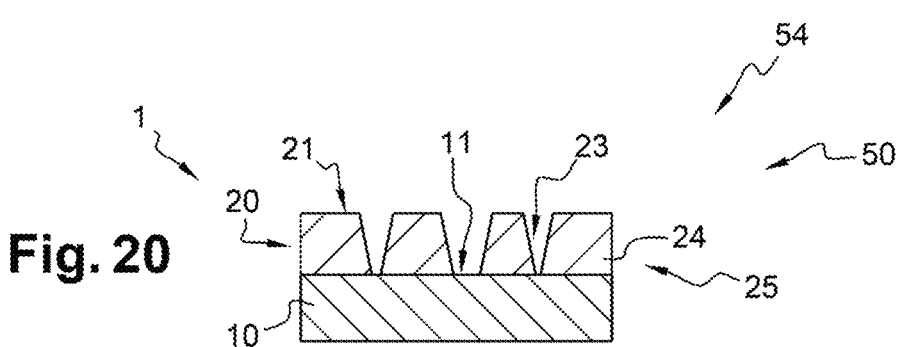

FIG. 20 shows the layer of material 20 after developing by the unit 54. The layer 20 thus forms the mask 25, which is arranged on the substrate 10. The removal areas 23 are situated around and between the droplets 30 of FIG. 19, while the material areas 24 are situated under the droplets 30 of FIG. 19 in the form of columns of material.

Figure 21:
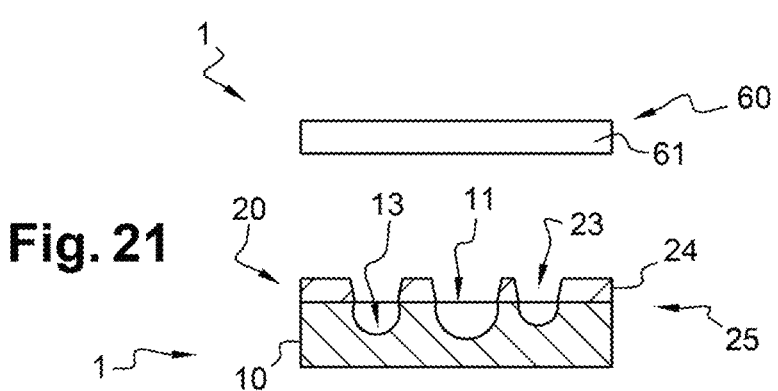

FIG. 21 shows the microtexturing of the surface 11 through the mask 25. The arrangement of the cavities 13, and therefore the microtexturing profile 14 formed at the surface 11, depends on the arrangement of the areas 23 and 24 of the layer 20 forming the mask 25. After etching, the resin residues of the layer 20 are removed from the substrate 10.

Figure 22:
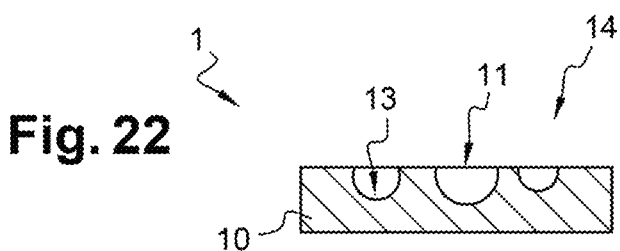

FIG. 22 shows the final substrate 10, having cavities 13 distributed according to the microtexturing profile 14. As the arrangement 31 of droplets 30 was irregular, the cavities 13 have irregular shapes, dimensions and distribution.

Figure 23:
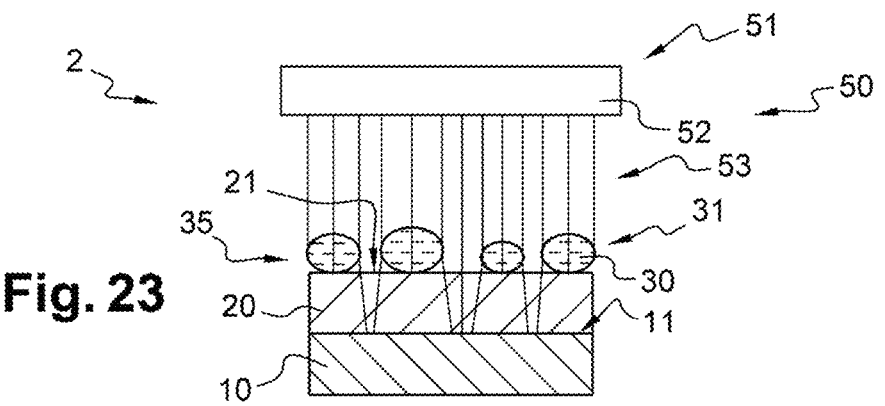
FIGS. 23 to 25 are cross-section views analogous to FIGS. 6, 7 and 9 respectively, for a variant of the invention implementing occulting droplets.
Figure 24:
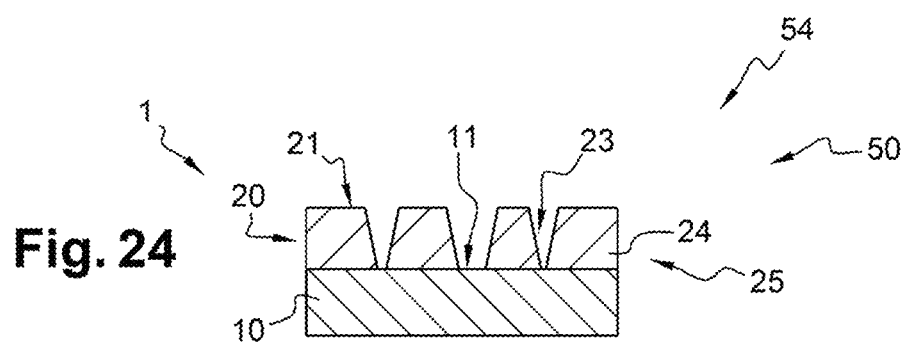
Figure 25:
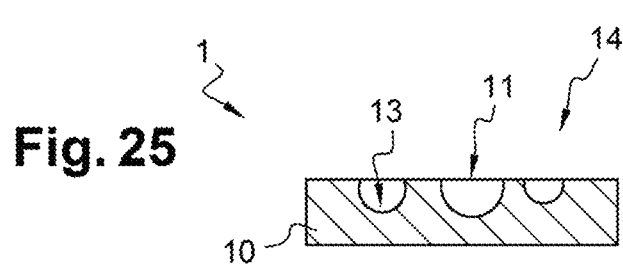
Figure 26:
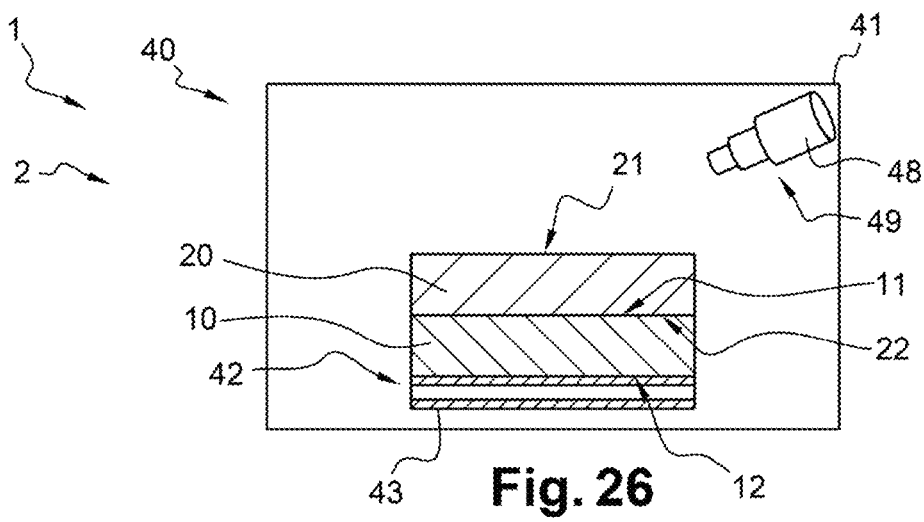
FIGS. 26 to 32 are cross-section views analogous to FIGS. 3 to 9 respectively, for a variant of the invention implementing a regular arrangement of droplets of the same shape and same dimensions.

In the embodiment of FIGS. 23 to 25, the layer 20 is made from positive photosensitive resin, and the droplets 30 fulfill an optical function of occulting the luminous flux 53. The droplets 30 are for example constituted of a colored solution, opaque liquid polymer or metal.

In FIG. 23, during exposure by unit 51, the areas of the layer 20 exposed to the beam 53 become soluble to development, while the areas of the layer 20 which are not exposed or weakly exposed remain insoluble. FIG. 24 shows the layer of material 20 forming the mask 25 on the substrate 10, after developing by the unit 54. FIG. 25 shows the final substrate 10, having cavities 13 distributed according to the microtexturing profile 14.

In the embodiment of FIGS. 26 to 32, the droplets 30 condense on the surface 21 according to a regular and non-random arrangement 31.

Before introduction of the substrate 10 coated with the layer 20 into the enclosure 41, the layer 20 receives a functionalization pretreatment, enabling the preferential fixing sites of the droplets 30 to be defined on the surface 21. The functionalization pretreatment may be carried out by laser, plasma, exposure or any other suitable means. For example, scanning of the surface 21 is performed by generating laser pulses, according to a regular, non-random pattern.

Figure 27:
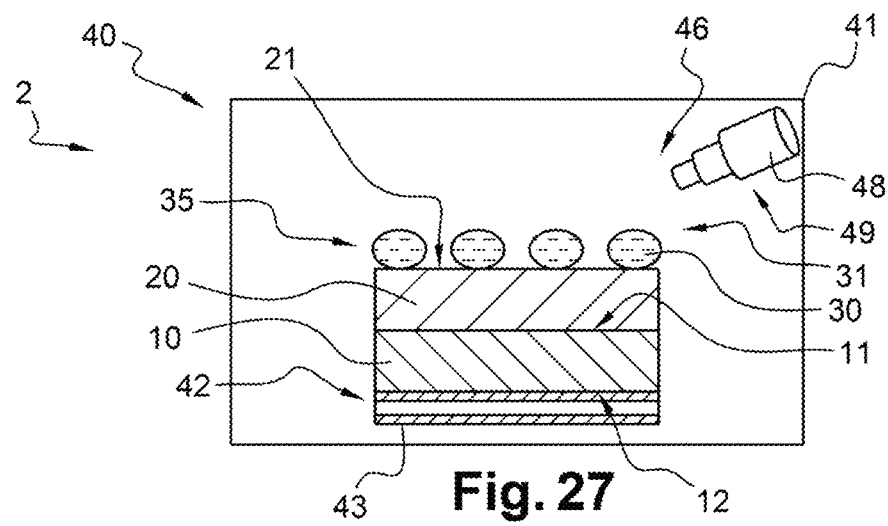
Figure 28:
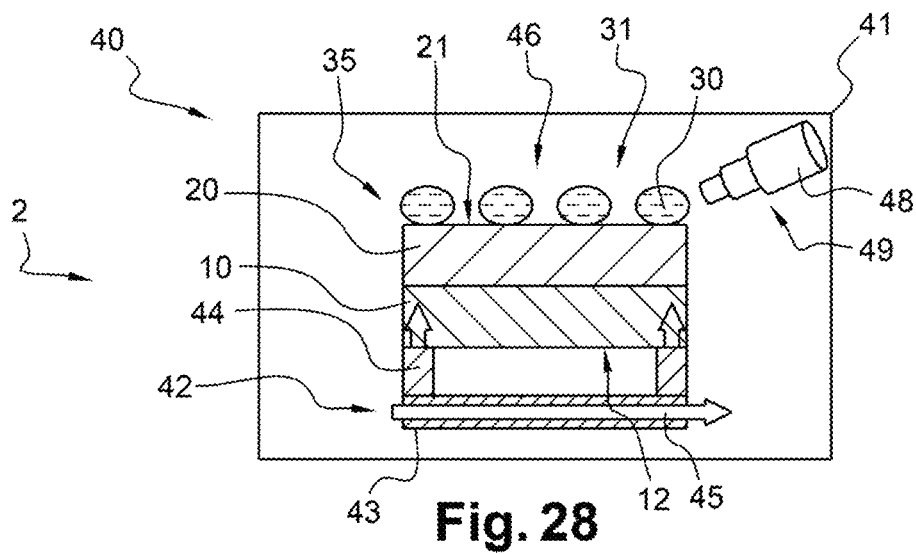
Figure 29:
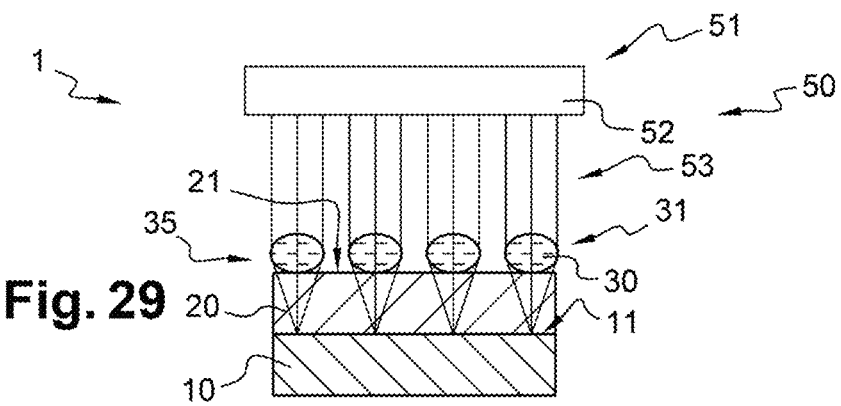
Figure 30:
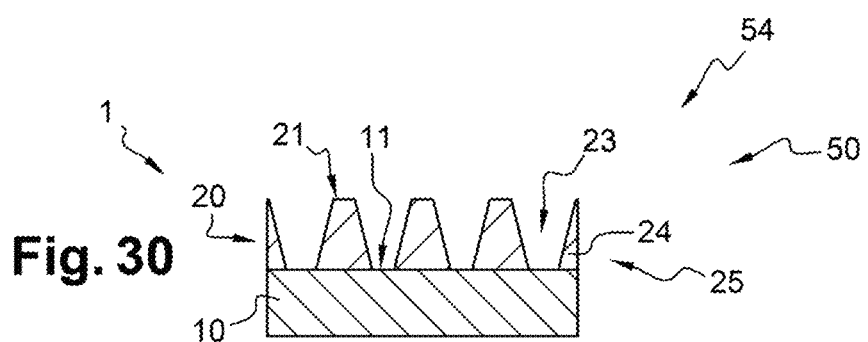
Figure 31:
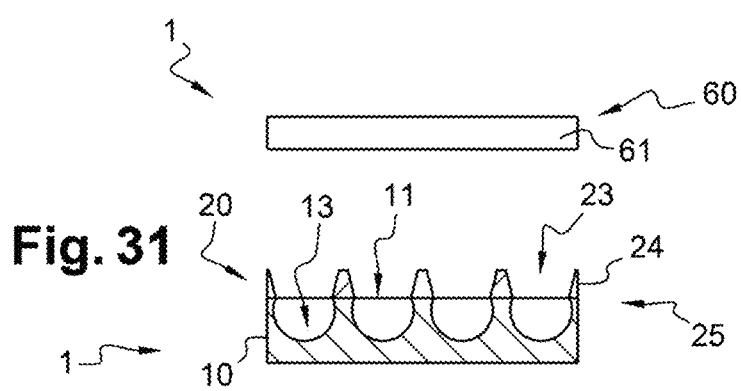
Figure 32:
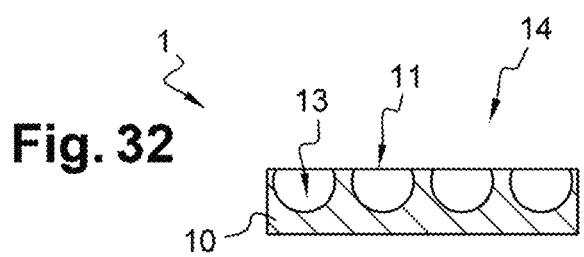

FIGS. 27 to 29 show the droplets 30 condensed on the surface 21 according to a regular arrangement 31. FIGS. 29 to 32 show successively the exposure of the layer 20, the development of the layer 20, the microtexturing of the substrate 10, then the final substrate 10 having cavities 13 distributed according to the microtexturing profile 14. In this embodiment, the cavities 13 have regular shapes, dimensions and distribution.

Figure 33:
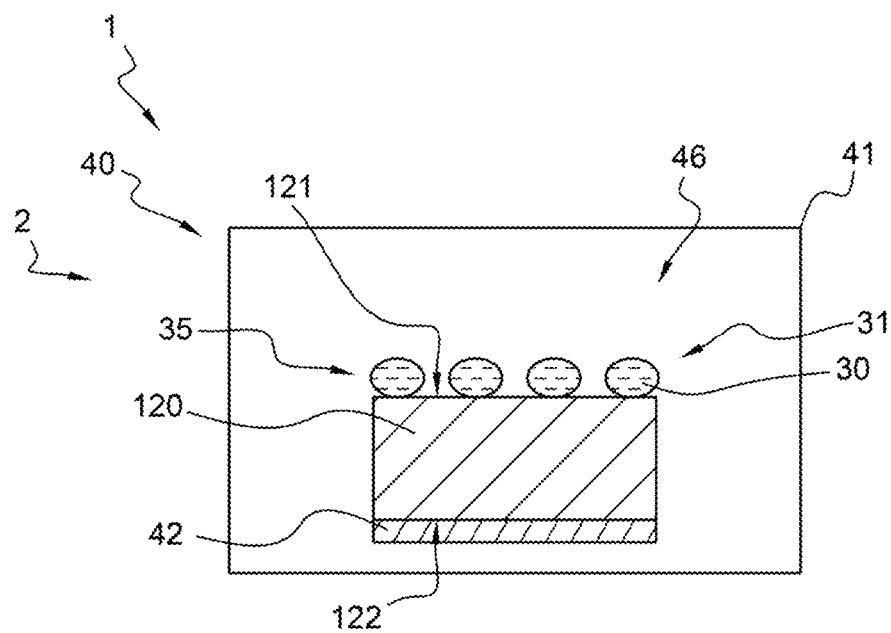
FIGS. 33 to 35 are cross-section views analogous to FIGS. 27, 29 and 32 respectively, for a variant of the invention implementing a layer of material to be textured not deposited on a substrate.
Figure 34:
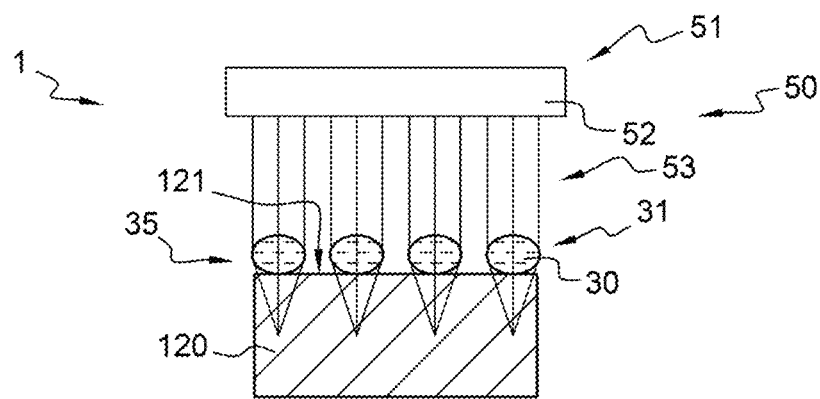
Figure 35:
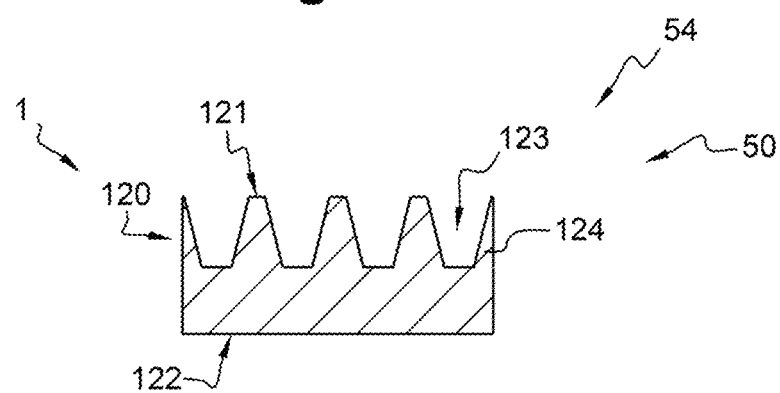

In the embodiment of FIGS. 33 to 35, the plant 1 is implemented to texture the outer surface 121 of a layer 120 of photosensitive material, without this layer 120 being associated with a substrate 10 such as that of the first embodiment.

FIG. 33 shows the layer 120 positioned in a generating and depositing device 40, intended to create droplets 30 then deposit said droplets on the surface 121. The device 40 comprises a sealed enclosure 41 and a cooling unit 42 supporting the surface 122 of the layer 120. After depositing and condensation, the droplets 30 distributed according to the arrangement 31 form the optical mask 35 on the surface 121 of the layer 120.

FIGS. 34 and 35 show a device 50 of localized removal of the layer of material 120, depending on the arrangement 31 of the droplets 30 on the surface 121. The device 50 comprises an exposure unit 51 and a developing unit 54. After developing by the unit 54, the layer 120 has areas 123 of removed material and areas 124 of remaining material.

In practice, the extent and distribution of areas 123 may be controlled by acting on the arrangement 31 of the droplets 30 forming the optical mask 35, the material of the layer 30, the treatments applied to the surface 121 before depositing the droplets 30, the exposure duration, etc.

Figure 36:
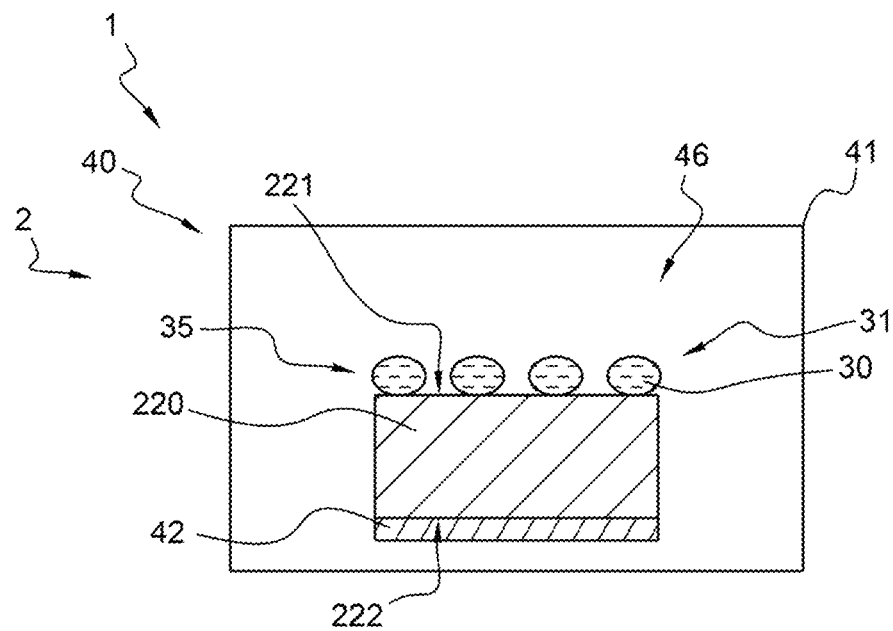
FIGS. 36 to 38 are cross-section views analogous to FIGS. 33 to 35 respectively, illustrating a surface treatment method other than microtexturing.
Figure 37:
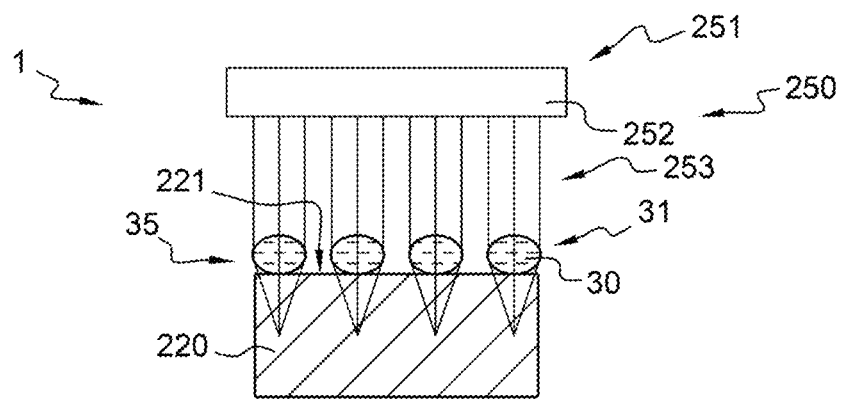
Figure 38:
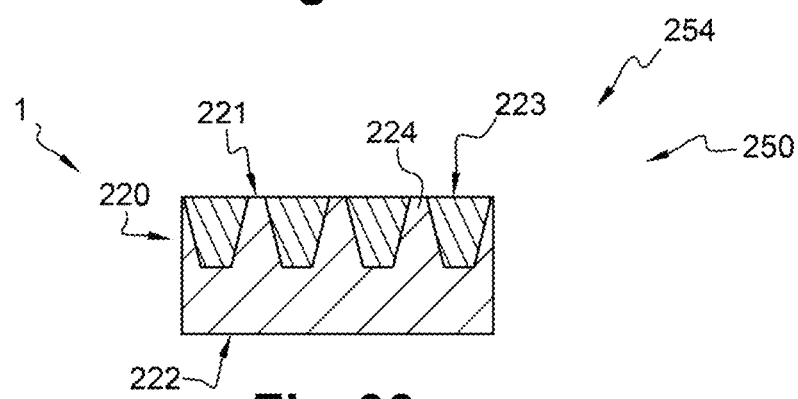

In the embodiment of FIGS. 36 to 38 (corresponding to a variant of FIGS. 33 to 35) a surface treatment plant 1 is represented. This plant 1 is designed to modify the properties of the outer surface 221 of a layer 220, without modifying its relief.

FIG. 36 shows the formation of a mask 35 constituted of droplets 30 on the surface 221, in a similar way to FIG. 33. The cooling unit 42 supports the surface 222 of the layer 220.

FIGS. 37 and 38 show a device 250 for the localized treatment of the layer of material 220 in the case where said layer of material is photosensitive, depending on the arrangement 31 of the droplets 30 on the surface 221. More precisely, the step of localized treatment of the layer 220 comprises an exposure sub-step shown in FIG. 37, and a development sub-step shown in FIG. 38. The device 50 comprises an exposure unit 251 and a developing unit 254. The exposure unit 251 comprises a light source 252 emitting a luminous flux 253 which passes through the droplets 30 to reach the surface 221. The developing unit 254 enables at least one characteristic of the layer of material 220 to be modified at the level of the surface 221, such as for example the color or the chemical reactivity thereof. After developing, the layer 220 comprises areas 223 having a localized change in characteristic(s), for example browning, and areas 224 having the original characteristics of the layer 220.

In this embodiment, the treatment is carried out by implementing a layer of material 220 and a treatment device 250 different from the preceding embodiments. More precisely, the layer 220 is a photoreactive resin different from layers 20 and 120, while the device 250 has different constituent elements from the device 50, in order to treat the layer 220, and in particular the surface 221, without modifying the relief thereof. Alternatively, the plant 1 may have a layer 220 treated by the device 50, or even a layer 20 or 120 treated by the device 250.

Other surface treatment plants 1 may be implemented without departing from the scope of the invention, in order to modify different properties of the treated surface, without necessarily modifying the relief thereof.

Figure 39:
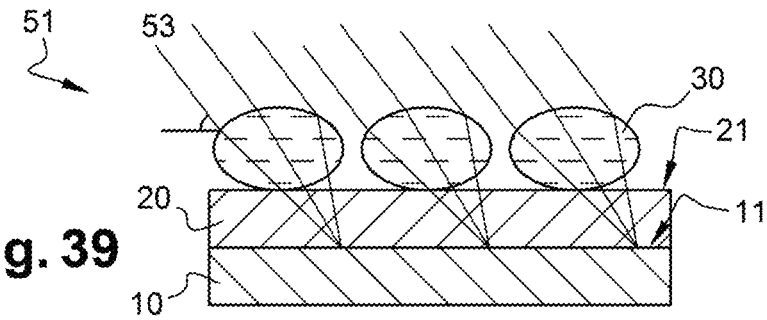
FIGS. 39 and 40 are cross-section views analogous to FIGS. 6 and 7 respectively, for a variant of the invention implementing an oblique beam.
Figure 40:
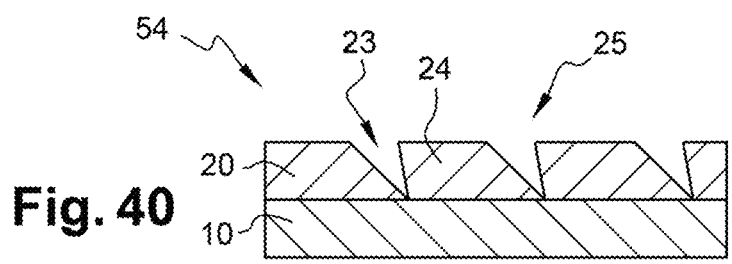
Figure 41:
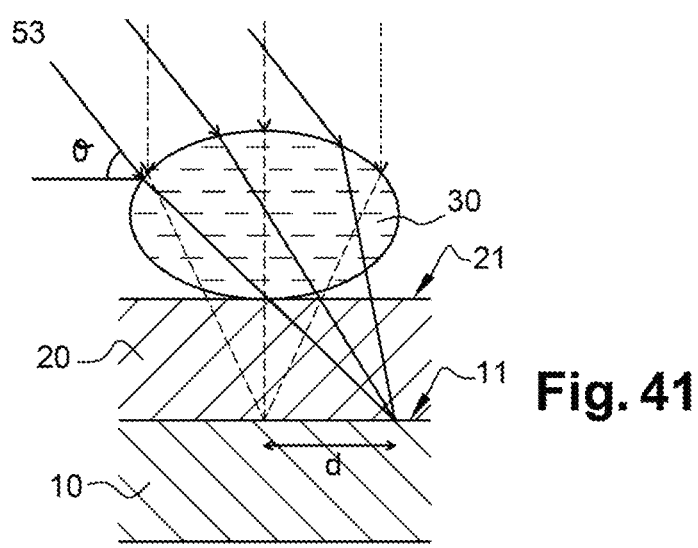
FIG. 41 is a cross-section view analogous to FIG. 39 on a larger scale.

In the embodiment of FIGS. 39 to 41, the light beam 53 is directed onto the droplets 30 according to an oblique angle of incidence, relative to a normal direction to the surface 21 of the layer 20. Under these conditions, the pattern forming the mask 25 is also oblique.

As shown in FIG. 41, this pattern is translated by a distance "d" relative to the center of the droplet 30, according to the angle of incidence of the light beam 53.

Figure 42:
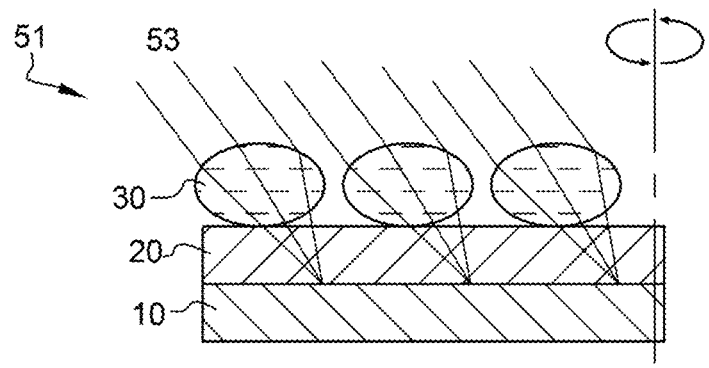
FIGS. 42 and 43 are cross-section views analogous to FIGS. 39 and 40 respectively, for a variant of the invention implementing an oblique beam, inclined along two directions opposite to 180°.
Figure 43:
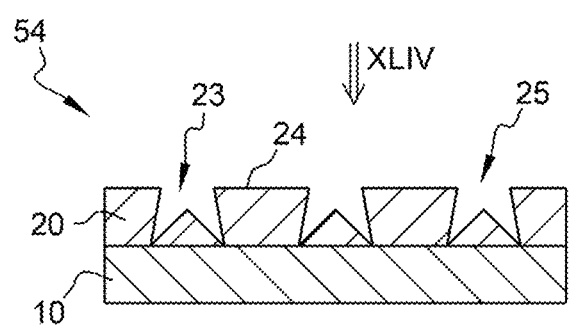
Figure 44:
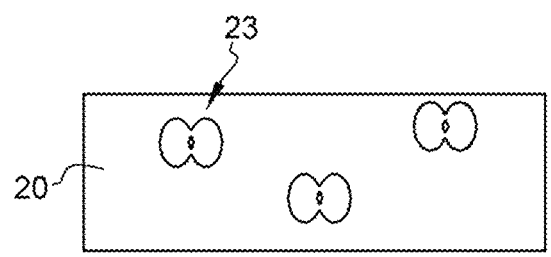
FIG. 44 is a view from above of the layer of resin after development, along arrow XLIV in FIG. 43.

In the embodiment of FIGS. 42 to 44, the layer 20 is subjected to multiple exposures, under a beam 53 having an oblique angle of incidence, combined with a rotation of the substrate 10.

As shown in FIG. 42, the layer 20 is exposed to a beam 53 having an oblique angle of incidence, then the substrate 10 pivots through 180° around an axis normal to the surface 21, then the layer 20 is exposed again to a beam 53 having an oblique angle of incidence.

As shown in FIGS. 43 and 44, during an exposure under an angle of incidence different from the normal, it is possible to obtain pattern geometries other than cylindrical, due to the translation of the pattern inscribed relative to the center of the droplet 30.

Figure 45:
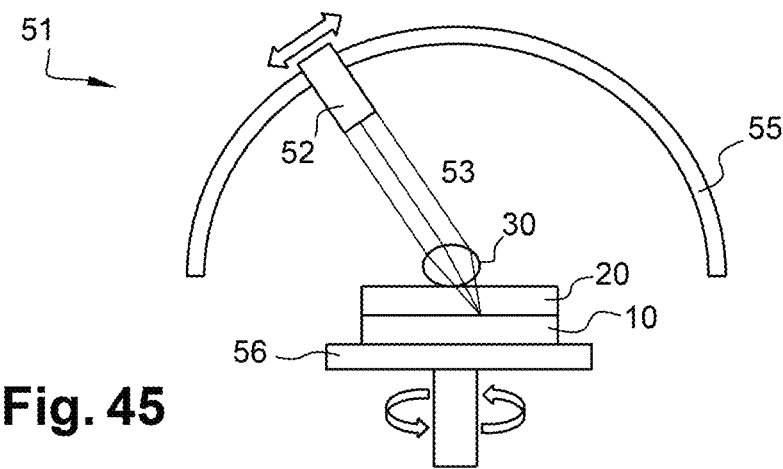
FIG. 45 is a view analogous to FIG. 39, on a smaller scale, showing an example of an exposure unit 51.

FIG. 45 shows an example of an exposure unit 51 designed to expose the droplets 30 and the layer 20 to an oblique light beam 53.

The unit 51 comprises a hemispherical rail 55, on which a light source 52 is mounted, for example a collimated UV light source. Moving the source 52 along the rail 55 enables the angle of incidence of the beam 53 used to expose the photosensitive layer 20 to be modified.

The unit 51 also comprises a plate 56 that can rotate, receiving the substrate 10. The plate 56 can turn the substrate 10 and the layer 20 between each exposure operation of the photosensitive layer 20.

Figure 46:
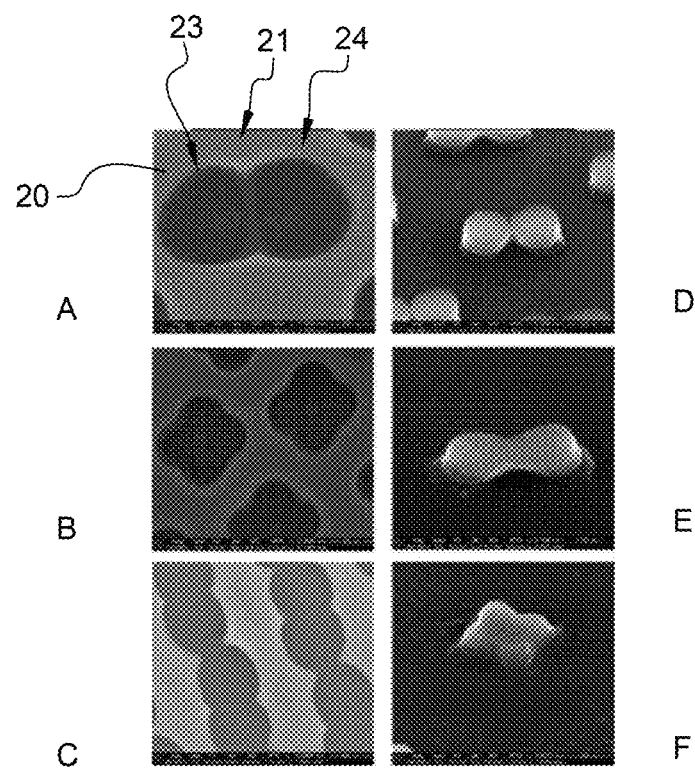
FIG. 46 shows different photographs taken with a scanning electron microscope, showing different examples of layers of resin after exposure under oblique beam then development.

FIG. 46 shows different examples of layers 20 of resin after exposure under oblique beam, then development.

On the left, the examples A, B and C are obtained with a positive photosensitive resin, while on the right, examples D, E and F are obtained with a negative photosensitive resin.

Examples A, C, D and E each show a layer 20 subjected to two successive exposures under oblique incidence, with a rotation through 180° between each exposure, enabling a "bow tie" pattern to be obtained.

Examples B and F each show a layer 20 subjected to four successive exposures under oblique incidence, with a rotation through 90° between each exposure, enabling a "four-leaf clover" pattern to be obtained.

Such patterns find applications for example in chemical analysis (field concentration, plasmonic effect) and in microbiology.

Figure 47:
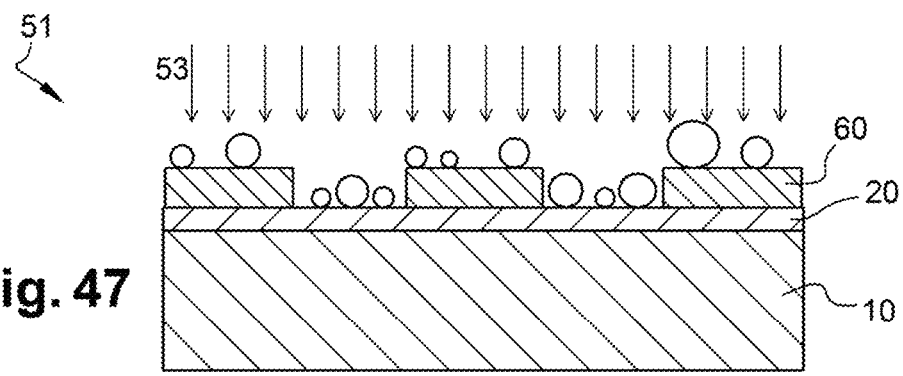
FIGS. 47 and 48 are cross-section views analogous to FIGS. 6 and 7 respectively, for one variant of the invention implementing a preliminary mask.
Figure 48:
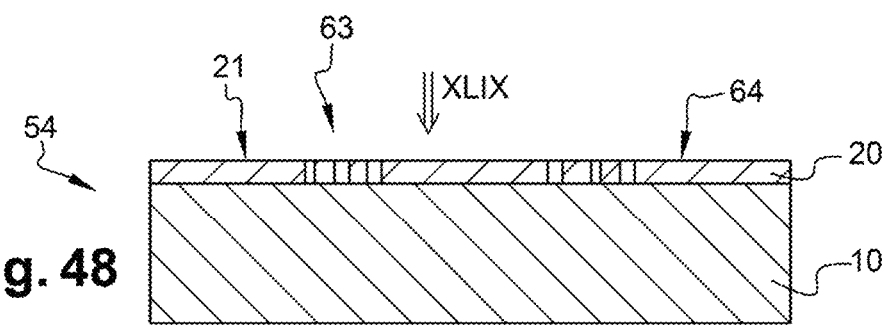
Figure 49:
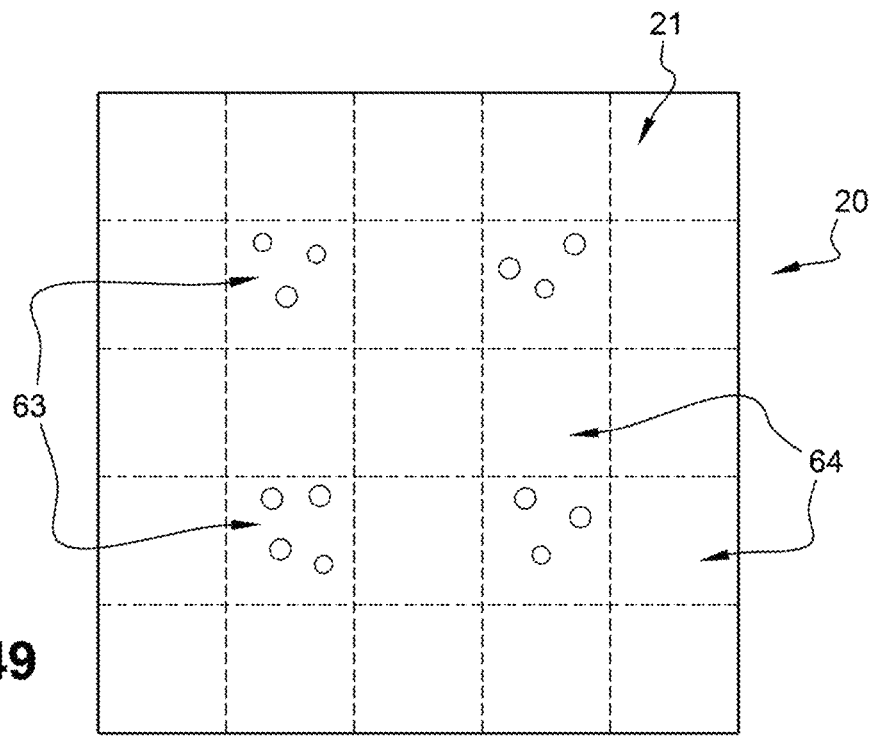
FIG. 49 is a top view of the layer of resin after development, along arrow XLIX in FIG. 48.

In the embodiment of FIGS. 47 to 49, the condensation of the droplets 30 takes place on a layer 20 having a sacrificial mask 60 in the form of a grid.

After exposure and development, the layer 20 has a microstructuration according to a predefined arrangement imposed by this mask 60. The layer 20 has areas 63 having recesses and areas 64 of intact material.

As shown in FIG. 49, the mask 60 imposes a periodic arrangement. After exposure of the layer 20 and the removal of the mask 60, the microstructuration carried out on the surface 21 is not distributed homogeneously, but according to this imposed periodicity (in one or several directions, depending on the construction of the mask 60).

At this stage, the layer 20 may receive condensed droplets 30 again. The areas 63 thus constitute preferential fixing sites for the droplets 30 on the surface 21. In other words, the mask 60 enables a functionalization pretreatment to be carried out on the layer 20.

Alternatively, the functionalization pretreatment may be carried out by laser, plasma, exposure or any other appropriate means, in order to define the preferential fixing sites of the droplets 30 on the surface 21.

Figure 50:
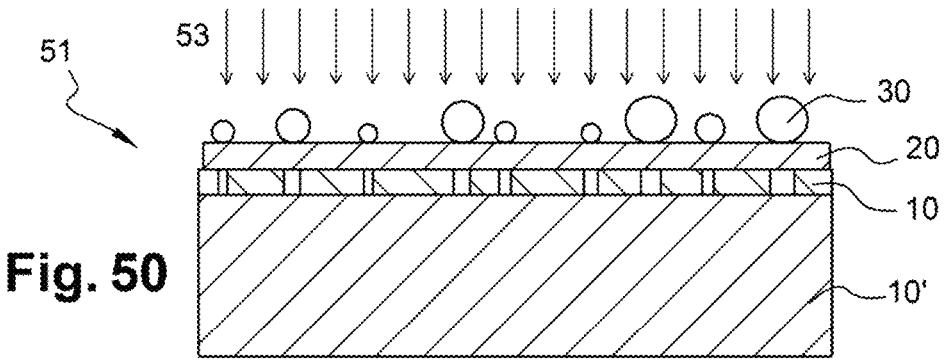
FIGS. 50 and 51 are cross-section views analogous to FIGS. 6 and 7 respectively, for one variant of the invention where the layer of material is permeable to luminous flux.
Figure 51:
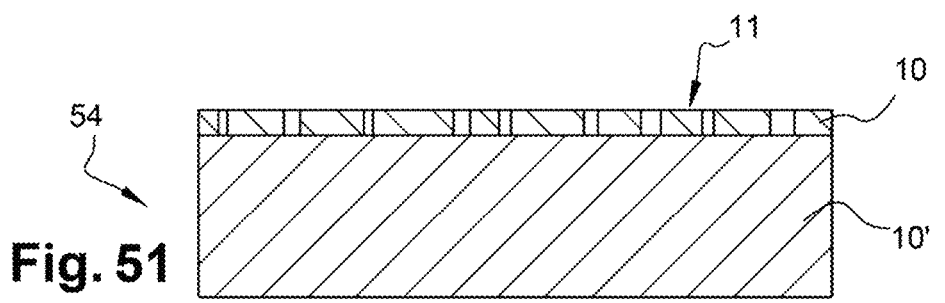

In the embodiment of FIGS. 50 and 51, the condensation of the droplets 30 is carried out on a layer 20 permeable to the luminous flux 53. The layer 20 may be transparent or translucent, for example made from glass or plastic material.

The droplets 30 deposited on the layer 20 form an optical mask 35 for the exposure of the substrate 10, itself positioned on a support 10'. The substrate 10 is for example made from photosensitive resin.

This approach, relative to previous approaches, differs in the fact that the mask 35 may be used several times on the same substrate 10, by moving the layer 20 and/or the substrate 10 during exposure. This enables a pattern defined by the optical mask 35 on the surface 11 of the substrate 10 to be regularly reproduced.

Figure 52:
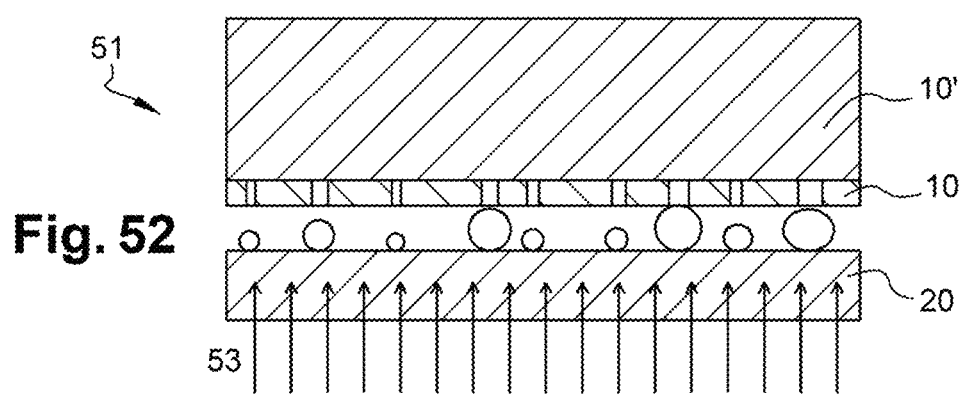
FIGS. 52 and 53 are cross-section views analogous to FIGS. 50 and 51 respectively, for one variant of the invention where the layer of material is permeable to luminous flux and is deposited under the substrate.
Figure 53:
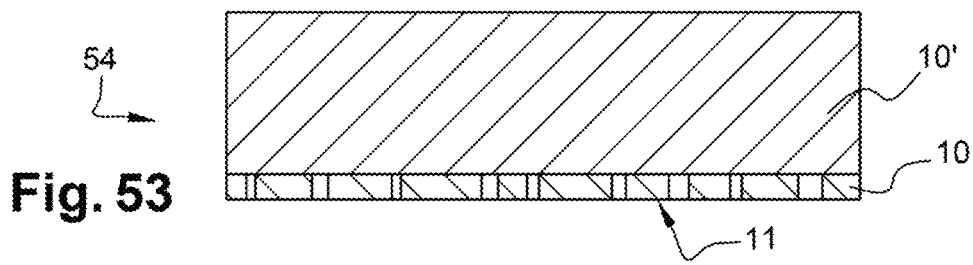

The embodiment of FIGS. 52 and 53 is a variant of that of FIGS. 50 and 51. The layer 20 having droplets 30 forming the mask 35 is deposited under the substrate 10. Again, the mask 35 may be used several times on the same substrate 10, by moving the layer 20 and/or the substrate 10 during exposure. This enables a pattern defined by the optical mask 35 on the surface 11 of the substrate 10 to be regularly reproduced.

The technical characteristics of the various embodiments and variants mentioned in the present description can be, in whole or for some of them, combined with each other. Thus, the plant 1 and the system 2 may be adapted in terms of cost, functionality and performance.

The invention claimed is:

1. A system for producing an optical mask for surface treatment, the system comprising:
    a layer of material which has an outer surface that is exposed to the outside environment; and
    a generating and depositing device for generating and depositing droplets on the outer surface of the layer of material, in a specific arrangement, forming the optical mask on the outer surface of the layer of material,
        wherein the outer surface of the layer of material is initially treated thereby defining preferential fixing sites of the droplets, thus enabling the arrangement of the droplets forming the optical mask on the outer surface to be controlled.

2. The system according to claim 1, wherein the system comprises a substrate having a surface covered by the layer of material.

3. The system according to claim 1, wherein the layer of material is permeable to the luminous flux, and wherein the system comprises a substrate having a surface arranged opposite the layer of material.

4. A surface treatment plant, comprising:
    a system for producing an optical mask according to claim 1; and
    a localized treatment device for localized treatment of the layer of material, depending on the arrangement of the droplets forming the optical mask on the outer surface, through the optical mask formed on the layer of material.

5. The plant according to claim 4, wherein the localized treatment device for the layer of material constitutes a localized removal device for the localized removal of the layer of material, depending on the arrangement of the droplets forming the optical mask on the outer surface of the layer of material, which thus comprises removal areas and material areas.

6. The plant according to claim 4, wherein the layer of material is made from a photosensitive material, and wherein the localized treatment device of the layer of material comprises, firstly, an exposure unit emitting a luminous flux which passes through the droplets and reaches the outer surface of the layer of material and, secondly, a developing unit of the layer of material after exposure to the luminous flux.

7. A surface treatment plant, comprising:
    a system for producing an optical mask according to claim 2;
    a localized treatment device for localized treatment of the layer of material, depending on the arrangement of the droplets forming the optical mask on the outer surface, through the optical mask formed on the layer of material, which thus has removal areas and material areas forming a second mask on the substrate; and
    a localized treatment device for localized treatment of the surface of the substrate through the second mask formed by the layer of material on the substrate.

8. The plant according to claim 6, wherein the localized treatment device for the surface of the substrate is a micro-texturing device.

9. The plant according to claim 7, wherein the layer of material is made from a photosensitive material, and wherein the localized treatment device of the layer of material comprises, firstly, an exposure unit emitting a luminous flux which passes through the droplets and reaches the outer surface of the layer of material and, secondly, a developing unit of the layer of material after exposure to the luminous flux.

10. A surface treatment plant, comprising:
    a system for producing an optical mask according to claim 3;
    a localized treatment device for localized treatment of the substrate, depending on the arrangement of the droplets forming the optical mask on the outer surface of the layer of material, through the optical mask formed on the layer of material permeable to the luminous flux.

11. The plant according to claim 10, wherein the substrate is made from a photosensitive material, and wherein the localized treatment device for the substrate comprises, firstly, an exposure unit emitting a luminous flux which passes through the droplets and reaches the surface of the substrate and, secondly, a developing unit of the substrate after exposure to the luminous flux.

12. A method for producing an optical mask for surface treatment, wherein the method comprises the following steps:
    a step of providing a layer of material having an outer surface that is exposed to the outside environment;
    a step of pretreating the layer of material, the pretreatment defining preferential fixing sites of the droplets to the outer surface of the layer of material, thus enabling arrangement of the droplets forming the optical mask on the outer surface to be controlled; and
    a step of generating and depositing droplets on the outer surface of the layer of material, in a specific arrangement, thus forming the optical mask on the outer surface of the layer of material.

13. A surface treatment method, wherein the method comprises the following successive steps:
    a) a step of providing a layer of material having an outer surface that is exposed to the outside environment;
    b) a step of pretreating the layer of material, the pretreatment defining preferential fixing sites of the droplets to the outer surface of the layer of material, thus enabling arrangement of the droplets forming the optical mask on the outer surface to be controlled;
    c) a step of generating and depositing droplets on the outer surface of the layer of material, in a specific arrangement, thus forming the optical mask on the outer surface of the layer of material; and
    d) a step of localized treatment of the layer of material depending on the arrangement of the droplets on the outer surface, through the optical mask formed on the layer of material.

14. The surface treatment method according to claim 13, wherein the step of generating and depositing droplets is repeated several times to modify the arrangement of the droplets forming the optical mask, before carrying out the next step.

15. A surface treatment method, wherein the method comprises the following successive steps:
    a) a step of providing a substrate having a surface covered by a layer of material, having an outer surface that is exposed to the outside environment;
    b) a step of pretreating the layer of material, the pretreatment defining preferential fixing sites of the droplets to the outer surface of the layer of material, thus enabling arrangement of the droplets forming the optical mask on the outer surface to be controlled;

c) a step of generating and depositing droplets on the outer surface of the layer of material, in a specific arrangement, thus forming an optical mask on the outer surface of the layer of material;

d) a step of localized removal of the layer of material depending on the arrangement of the droplets on the outer surface, through the optical mask formed on the layer of material, which thus has removal areas and material areas forming a second mask on the substrate; and e) a step of localized treatment of the surface of the substrate through the second mask formed by the layer of material on the substrate.

16. A surface treatment method, wherein the method comprises the following successive steps:

a) a step of providing a layer of material permeable to luminous radiation and having an outer surface that is exposed to the outside environment;

b) a step of pretreating the layer of material, the pretreatment defining preferential fixing sites of the droplets to the outer surface of the layer of material, thus enabling arrangement of the droplets forming the optical mask on the outer surface to be controlled;

c) a step of providing a substrate having a surface arranged opposite to the layer of material;

d) a step of generating and depositing droplets on the outer surface of the layer of material, in a specific arrangement, thus forming an optical mask on the outer surface of the layer of material;

e) a step of localized treatment of the surface of the substrate through the optical mask formed by the droplets on the layer of material.

17. The surface treatment method according to claim 16, wherein during the treatment step e), a relative displacement may be carried out between the surface of the substrate and the layer of material supporting the droplets forming the optical mask, so as to regularly reproduce on the surface of the substrate a pattern defined by the optical mask.

* * * * *